(12) United States Patent
Higashino

(10) Patent No.: US 8,384,567 B2
(45) Date of Patent: Feb. 26, 2013

(54) ENCODING APPARATUS AND METHOD, RECORDING APPARATUS AND METHOD, AND DECODING APPARATUS AND METHOD

(75) Inventor: Satoru Higashino, Tokyo (JP)

(73) Assignee: Sony Corporation, Tokyo (JP)

( * ) Notice: Subject to any disclaimer, the term of this patent is extended or adjusted under 35 U.S.C. 154(b) by 53 days.

(21) Appl. No.: 13/097,441

(22) Filed: Apr. 29, 2011

(65) Prior Publication Data

US 2011/0273976 A1 Nov. 10, 2011

(30) Foreign Application Priority Data

May 6, 2010 (JP) ................................. 2010-106591
Dec. 9, 2010 (JP) ................................. 2010-274548

(51) Int. Cl.
*H03M 7/00* (2006.01)
(52) U.S. Cl. .......................................... 341/59; 341/58
(58) Field of Classification Search .................. 341/59, 341/58, 52; 369/47.15, 59.24, 275.1, 275.4; 720/718
See application file for complete search history.

(56) References Cited

U.S. PATENT DOCUMENTS

| 5,696,505 | A | 12/1997 | Schouhamer Immink |
| 2001/0017594 | A1* | 8/2001 | Ahn ................. 341/59 |
| 2007/0186840 | A1 | 8/2007 | Dvorak |
| 2008/0205257 | A1 | 8/2008 | Yamatsu et al. |

FOREIGN PATENT DOCUMENTS

| JP | 2008-176902 A | 7/2008 |
| JP | 2009-135144 A | 6/2009 |
| WO | WO 95/22802 | 8/1995 |

OTHER PUBLICATIONS

Schouhamer Immink, Kees A., "EFMPlus:The Coding Format of the Multimedia Compact Disc", IEEE Transaction on Consumer Electronics, Aug. 3, 1995, pp. 491-497, vol. 41, No. 3, The Netherlands.

* cited by examiner

*Primary Examiner* — Joseph Lauture
(74) *Attorney, Agent, or Firm* — Wolf, Greenfield & Sacks, P.C.

(57) ABSTRACT

An encoding apparatus that converts m-bit data words into n-bit code words, where m and n are both integers and satisfy an expression $2^n \geq 2^m \times 2$, includes a first conversion table in which $2^m$ m-bit data words are associated with $2^m$ n-bit code words selected from $2^n$ n-bit code words, a second conversion table in which the $2^m$ m-bit data words are associated with $2^m$ n-bit code words that have been selected from the $2^n$ n-bit code words and that do not overlap with the $2^m$ n-bit code words in the first conversion table, and an encoder configured to select and output an n-bit code word with which an m-bit data word that has been input is associated in the first conversion table or an n-bit code word with which the m-bit data word that has been input is associated in the second conversion table, the selected and output n-bit code word having a smaller number of symbols "1".

18 Claims, 32 Drawing Sheets

FIG. 3

```
S1 Code Table
Data    Code                    State   Occ
0x0     1001001001001000        1       5
0x1     1001001001000100        1       5
0x2     1001001000100100        1       5
0x3     1001000100100100        1       5
0x4     1000100100100100        1       5
0x5     1001001001000000        1       4
0x6     1001001000100000        1       4
0x7     1001000100100000        1       4
0x8     1000100100100000        1       4
0x9     0100100100100000        1       4
0xa     1001001000010000        1       4
0xb     1001000100010000        1       4
0xc     1000100100010000        1       4
0xd     0100100100010000        1       4
0xe     1001000010010000        1       4
0xf     1000100010010000        1       4
0x10    0100100010010000        1       4
0x11    1000010010010000        1       4
0x12    0100010010010000        1       4
0x13    1001001000001000        1       4
0x14    1001000100001000        1       4
0x15    1000100100001000        1       4
0x16    0100100100001000        1       4
0x17    1001000010001000        1       4
0x18    1000100010001000        1       4
0x19    0100100010001000        1       4
0x1a    1000010010001000        1       4
0x1b    0100010010001000        1       4
0x1c    1001000001001000        1       4
0x1d    1000100001001000        1       4
0x1e    0100100001001000        1       4
0x1f    1000010001001000        1       4
0x20    0100010001001000        1       4
0x21    1000001001001000        1       4
0x22    0100001001001000        1       4
0x23    1001001000000100        1       4
0x24    1001000100000100        1       4
0x25    1000100100000100        1       4
0x26    0100100100000100        1       4
0x27    1001000010000100        1       4
0x28    1000100010000100        1       4
0x29    0100100010000100        1       4
0x2a    1000010010000100        1       4
0x2b    0100010010000100        1       4
0x2c    1001000001000100        1       4
0x2d    1000100001000100        1       4
0x2e    0100100001000100        1       4
0x2f    1000010001000100        1       4
0x30    0100010001000100        1       4
0x31    1000001001000100        1       4
0x32    0100001001000100        1       4
0x33    1001000000100100        1       4
0x34    1000100000100100        1       4
0x35    0100100000100100        1       4
0x36    1000010000100100        1       4
0x37    0100010000100100        1       4
0x38    1000001000100100        1       4
0x39    0100001000100100        1       4
0x3a    1000000100100100        1       4
0x3b    0100000100100100        1       4
0x3c    1001001000000010        2       4
0x3d    1001000100000010        2       4
0x3e    1000100100000010        2       4
0x3f    0100100100000010        2       4
0x40    1001000010000010        2       4
0x41    1000100010000010        2       4
0x42    0100100010000010        2       4
0x43    1000010010000010        2       4
0x44    0100010010000010        2       4
0x45    1001000001000010        2       4
0x46    1000100001000010        2       4
0x47    0100100001000010        2       4
0x48    1000010001000010        2       4
0x49    0100010001000010        2       4
0x4a    1000001001000010        2       4
0x4b    0100001001000010        2       4
0x4c    1001000000100010        2       4
0x4d    1000100000100010        2       4
0x4e    0100100000100010        2       4
0x4f    1000010000100010        2       4
0x50    0100010000100010        2       4
0x51    1000001000100010        2       4
0x52    0100001000100010        2       4
0x53    1000000100100010        2       4
0x54    0100000100100010        2       4
0x55    1001000000010010        2       4
```

FIG. 4

| | | | |
|---|---|---|---|
| 0x56 | 1000100000010010 | 2 | 4 |
| 0x57 | 0100100000010010 | 2 | 4 |
| 0x58 | 1000010000010010 | 2 | 4 |
| 0x59 | 0100010000010010 | 2 | 4 |
| 0x5a | 1000001000010010 | 2 | 4 |
| 0x5b | 0100001000010010 | 2 | 4 |
| 0x5c | 1000000100010010 | 2 | 4 |
| 0x5d | 0100000100010010 | 2 | 4 |
| 0x5e | 1000000010010010 | 2 | 4 |
| 0x5f | 0100000010010010 | 2 | 4 |
| 0x60 | 1001001000000001 | 2 | 4 |
| 0x61 | 1001000100000001 | 2 | 4 |
| 0x62 | 1000100100000001 | 2 | 4 |
| 0x63 | 0100100100000001 | 2 | 4 |
| 0x64 | 1001000010000001 | 2 | 4 |
| 0x65 | 1000100010000001 | 2 | 4 |
| 0x66 | 0100100010000001 | 2 | 4 |
| 0x67 | 1000010010000001 | 2 | 4 |
| 0x68 | 0100010010000001 | 2 | 4 |
| 0x69 | 1001000001000001 | 2 | 4 |
| 0x6a | 1000100001000001 | 2 | 4 |
| 0x6b | 0100100001000001 | 2 | 4 |
| 0x6c | 1000010001000001 | 2 | 4 |
| 0x6d | 0100010001000001 | 2 | 4 |
| 0x6e | 1000001001000001 | 2 | 4 |
| 0x6f | 0100001001000001 | 2 | 4 |
| 0x70 | 1001000000100001 | 2 | 4 |
| 0x71 | 1000100000100001 | 2 | 4 |
| 0x72 | 0100100000100001 | 2 | 4 |
| 0x73 | 1000010000100001 | 2 | 4 |
| 0x74 | 0100010000100001 | 2 | 4 |
| 0x75 | 1000001000100001 | 2 | 4 |
| 0x76 | 0100001000100001 | 2 | 4 |
| 0x77 | 1000000100100001 | 2 | 4 |
| 0x78 | 0100000100100001 | 2 | 4 |
| 0x79 | 1001000000010001 | 2 | 4 |
| 0x7a | 1000100000010001 | 2 | 4 |
| 0x7b | 0100100000010001 | 2 | 4 |
| 0x7c | 1000010000010001 | 2 | 4 |
| 0x7d | 0100010000010001 | 2 | 4 |
| 0x7e | 1000001000010001 | 2 | 4 |
| 0x7f | 0100001000010001 | 2 | 4 |
| 0x80 | 1000000100010001 | 2 | 4 |
| 0x81 | 0100000100010001 | 2 | 4 |
| 0x82 | 1000000010010001 | 2 | 4 |
| 0x83 | 0100000010010001 | 2 | 4 |
| 0x84 | 1001000000001001 | 2 | 4 |
| 0x85 | 1000100000001001 | 2 | 4 |
| 0x86 | 0100100000001001 | 2 | 4 |
| 0x87 | 1000010000001001 | 2 | 4 |
| 0x88 | 0100010000001001 | 2 | 4 |
| 0x89 | 1000001000001001 | 2 | 4 |
| 0x8a | 0100001000001001 | 2 | 4 |
| 0x8b | 1000000100001001 | 2 | 4 |
| 0x8c | 0100000100001001 | 2 | 4 |
| 0x8d | 1000000010001001 | 2 | 4 |
| 0x8e | 0100000010001001 | 2 | 4 |
| 0x8f | 1000000001001001 | 2 | 4 |
| 0x90 | 0100000001001001 | 2 | 4 |
| 0x91 | 1001001000000000 | 1 | 3 |
| 0x92 | 1001000100000000 | 1 | 3 |
| 0x93 | 1000100100000000 | 1 | 3 |
| 0x94 | 0100100100000000 | 1 | 3 |
| 0x95 | 1001000010000000 | 1 | 3 |
| 0x96 | 1000100010000000 | 1 | 3 |
| 0x97 | 0100100010000000 | 1 | 3 |
| 0x98 | 1000010010000000 | 1 | 3 |
| 0x99 | 0100010010000000 | 1 | 3 |
| 0x9a | 1001000001000000 | 1 | 3 |
| 0x9b | 1000100001000000 | 1 | 3 |
| 0x9c | 0100100001000000 | 1 | 3 |
| 0x9d | 1000010001000000 | 1 | 3 |
| 0x9e | 0100010001000000 | 1 | 3 |
| 0x9f | 1000001001000000 | 1 | 3 |
| 0xa0 | 0100001001000000 | 1 | 3 |
| 0xa1 | 1001000000100000 | 1 | 3 |
| 0xa2 | 1000100000100000 | 1 | 3 |
| 0xa3 | 0100100000100000 | 1 | 3 |
| 0xa4 | 1000010000100000 | 1 | 3 |
| 0xa5 | 0100010000100000 | 1 | 3 |
| 0xa6 | 1000001000100000 | 1 | 3 |
| 0xa7 | 0100001000100000 | 1 | 3 |
| 0xa8 | 1000000100100000 | 1 | 3 |
| 0xa9 | 0100000100100000 | 1 | 3 |
| 0xaa | 1001000000010000 | 1 | 3 |
| 0xab | 1000100000010000 | 1 | 3 |

FIG. 5 {
| | | | |
|---|---|---|---|
| 0xac | 0100100000010000 | 1 | 3 |
| 0xad | 1000010000010000 | 1 | 3 |
| 0xae | 0100010000010000 | 1 | 3 |
| 0xaf | 1000001000010000 | 1 | 3 |
| 0xb0 | 0100001000010000 | 1 | 3 |
| 0xb1 | 1000000100010000 | 1 | 3 |
| 0xb2 | 0100000100010000 | 1 | 3 |
| 0xb3 | 1000000010010000 | 1 | 3 |
| 0xb4 | 0100000010010000 | 1 | 3 |
| 0xb5 | 1001000000001000 | 1 | 3 |
| 0xb6 | 1000100000001000 | 1 | 3 |
| 0xb7 | 0100100000001000 | 1 | 3 |
| 0xb8 | 1000010000001000 | 1 | 3 |
| 0xb9 | 0100010000001000 | 1 | 3 |
| 0xba | 1000001000001000 | 1 | 3 |
| 0xbb | 0100001000001000 | 1 | 3 |
| 0xbc | 1000000100001000 | 1 | 3 |
| 0xbd | 0100000100001000 | 1 | 3 |
| 0xbe | 1000000010001000 | 1 | 3 |
| 0xbf | 0100000010001000 | 1 | 3 |
| 0xc0 | 1000000001001000 | 1 | 3 |
| 0xc1 | 0100000001001000 | 1 | 3 |
| 0xc2 | 1001000000000100 | 1 | 3 |
| 0xc3 | 1000100000000100 | 1 | 3 |
| 0xc4 | 0100100000000100 | 1 | 3 |
| 0xc5 | 1000010000000100 | 1 | 3 |
| 0xc6 | 0100010000000100 | 1 | 3 |
| 0xc7 | 1000001000000100 | 1 | 3 |
| 0xc8 | 0100001000000100 | 1 | 3 |
| 0xc9 | 1000000100000100 | 1 | 3 |
| 0xca | 0100000100000100 | 1 | 3 |
| 0xcb | 1000000010000100 | 1 | 3 |
| 0xcc | 0100000010000100 | 1 | 3 |
| 0xcd | 1000000001000100 | 1 | 3 |
| 0xce | 0100000001000100 | 1 | 3 |
| 0xcf | 1000000000100100 | 1 | 3 |
| 0xd0 | 0100000000100100 | 1 | 3 |
| 0xd1 | 1001000000000010 | 2 | 3 |
| 0xd2 | 1000100000000010 | 2 | 3 |
| 0xd3 | 0100100000000010 | 2 | 3 |
| 0xd4 | 1000010000000010 | 2 | 3 |
| 0xd5 | 0100010000000010 | 2 | 3 |
| 0xd6 | 1000001000000010 | 2 | 3 |
| 0xd7 | 0100001000000010 | 2 | 3 |
| 0xd8 | 1000000100000010 | 2 | 3 |
| 0xd9 | 0100000100000010 | 2 | 3 |
| 0xda | 1000000010000010 | 2 | 3 |
| 0xdb | 0100000010000010 | 2 | 3 |
| 0xdc | 1000000001000010 | 2 | 3 |
| 0xdd | 0100000001000010 | 2 | 3 |
| 0xde | 1000000000100010 | 2 | 3 |
| 0xdf | 0100000000100010 | 2 | 3 |
| 0xe0 | 1000000000010010 | 2 | 3 |
| 0xe1 | 0100000000010010 | 2 | 3 |
| 0xe2 | 1000100000000001 | 2 | 3 |
| 0xe3 | 0100100000000001 | 2 | 3 |
| 0xe4 | 1000010000000001 | 2 | 3 |
| 0xe5 | 0100010000000001 | 2 | 3 |
| 0xe6 | 1000001000000001 | 2 | 3 |
| 0xe7 | 0100001000000001 | 2 | 3 |
| 0xe8 | 1000000100000001 | 2 | 3 |
| 0xe9 | 0100000100000001 | 2 | 3 |
| 0xea | 1000000010000001 | 2 | 3 |
| 0xeb | 0100000010000001 | 2 | 3 |
| 0xec | 1000000001000001 | 2 | 3 |
| 0xed | 0100000001000001 | 2 | 3 |
| 0xee | 1000000000100001 | 2 | 3 |
| 0xef | 0100000000100001 | 2 | 3 |
| 0xf0 | 1000000000010001 | 2 | 3 |
| 0xf1 | 0100000000010001 | 2 | 3 |
| 0xf2 | 0100000000001001 | 2 | 3 |
| 0xf3 | 1000000100000000 | 1 | 2 |
| 0xf4 | 0100000100000000 | 1 | 2 |
| 0xf5 | 1000000010000000 | 1 | 2 |
| 0xf6 | 0100000100000000 | 1 | 2 |
| 0xf7 | 1000000001000000 | 1 | 2 |
| 0xf8 | 0100000001000000 | 1 | 2 |
| 0xf9 | 1000000001000000 | 1 | 2 |
| 0xfa | 0100000001000000 | 1 | 2 |
| 0xfb | 1000000000100000 | 1 | 2 |
| 0xfc | 0100000000100000 | 1 | 2 |
| 0xfd | 1000000000010000 | 1 | 2 |
| 0xfe | 0100000000010000 | 1 | 2 |
| 0xff | 0100000000001000 | 1 | 2 |
}

FIG. 6

S2 Code Table

| Data | Code | State | Occ |
|---|---|---|---|
| 0x0 | 0000001000000000 | 1 | 1 |
| 0x1 | 0000000100000000 | 1 | 1 |
| 0x2 | 0000000010000000 | 1 | 1 |
| 0x3 | 0000000001000000 | 1 | 1 |
| 0x4 | 0010001000000000 | 1 | 2 |
| 0x5 | 0001001000000000 | 1 | 2 |
| 0x6 | 0010000100000000 | 1 | 2 |
| 0x7 | 0001000100000000 | 1 | 2 |
| 0x8 | 0000100100000000 | 1 | 2 |
| 0x9 | 0010000010000000 | 1 | 2 |
| 0xa | 0001000010000000 | 1 | 2 |
| 0xb | 0000100010000000 | 1 | 2 |
| 0xc | 0000010010000000 | 1 | 2 |
| 0xd | 0010000001000000 | 1 | 2 |
| 0xe | 0001000001000000 | 1 | 2 |
| 0xf | 0000100001000000 | 1 | 2 |
| 0x10 | 0000010001000000 | 1 | 2 |
| 0x11 | 0000001001000000 | 1 | 2 |
| 0x12 | 0010000000100000 | 1 | 2 |
| 0x13 | 0001000000100000 | 1 | 2 |
| 0x14 | 0000100000100000 | 1 | 2 |
| 0x15 | 0000010000100000 | 1 | 2 |
| 0x16 | 0000001000100000 | 1 | 2 |
| 0x17 | 0000000100100000 | 1 | 2 |
| 0x18 | 0010000000010000 | 1 | 2 |
| 0x19 | 0001000000010000 | 1 | 2 |
| 0x1a | 0000100000010000 | 1 | 2 |
| 0x1b | 0000010000010000 | 1 | 2 |
| 0x1c | 0000001000010000 | 1 | 2 |
| 0x1d | 0000000100010000 | 1 | 2 |
| 0x1e | 0000000010010000 | 1 | 2 |
| 0x1f | 0010000000001000 | 1 | 2 |
| 0x20 | 0001000000001000 | 1 | 2 |
| 0x21 | 0000100000001000 | 1 | 2 |
| 0x22 | 0000010000001000 | 1 | 2 |
| 0x23 | 0000001000001000 | 1 | 2 |
| 0x24 | 0000000100001000 | 1 | 2 |
| 0x25 | 0000000010001000 | 1 | 2 |
| 0x26 | 0000000001001000 | 1 | 2 |
| 0x27 | 0010000000000100 | 1 | 2 |
| 0x28 | 0001000000000100 | 1 | 2 |
| 0x29 | 0000100000000100 | 1 | 2 |
| 0x2a | 0000010000000100 | 1 | 2 |
| 0x2b | 0000001000000100 | 1 | 2 |
| 0x2c | 0000000100000100 | 1 | 2 |
| 0x2d | 0000000010000100 | 1 | 2 |
| 0x2e | 0000000001000100 | 1 | 2 |
| 0x2f | 0010000000000010 | 2 | 2 |
| 0x30 | 0001000000000010 | 2 | 2 |
| 0x31 | 0000100000000010 | 2 | 2 |
| 0x32 | 0000010000000010 | 2 | 2 |
| 0x33 | 0000001000000010 | 2 | 2 |
| 0x34 | 0000000010000010 | 2 | 2 |
| 0x35 | 0000000001000010 | 2 | 2 |
| 0x36 | 0000100000000001 | 2 | 2 |
| 0x37 | 0000010000000001 | 2 | 2 |
| 0x38 | 0000001000000001 | 2 | 2 |
| 0x39 | 0000000100000001 | 2 | 2 |
| 0x3a | 0000000010000001 | 2 | 2 |
| 0x3b | 0000000001000001 | 2 | 2 |
| 0x3c | 0010010010000000 | 1 | 3 |
| 0x3d | 0010010001000000 | 1 | 3 |
| 0x3e | 0010001001000000 | 1 | 3 |
| 0x3f | 0001001001000000 | 1 | 3 |
| 0x40 | 0010010000100000 | 1 | 3 |
| 0x41 | 0010001000100000 | 1 | 3 |
| 0x42 | 0001001000100000 | 1 | 3 |
| 0x43 | 0010000100100000 | 1 | 3 |
| 0x44 | 0001000100100000 | 1 | 3 |
| 0x45 | 0000100100100000 | 1 | 3 |
| 0x46 | 0010010000010000 | 1 | 3 |
| 0x47 | 0010001000010000 | 1 | 3 |
| 0x48 | 0001001000010000 | 1 | 3 |
| 0x49 | 0010000100010000 | 1 | 3 |
| 0x4a | 0001000100010000 | 1 | 3 |
| 0x4b | 0000100100010000 | 1 | 3 |
| 0x4c | 0010000010010000 | 1 | 3 |
| 0x4d | 0001000010010000 | 1 | 3 |
| 0x4e | 0000100010010000 | 1 | 3 |
| 0x4f | 0000010010010000 | 1 | 3 |
| 0x50 | 0010010000001000 | 1 | 3 |
| 0x51 | 0010001000001000 | 1 | 3 |
| 0x52 | 0001001000001000 | 1 | 3 |
| 0x53 | 0010000100001000 | 1 | 3 |
| 0x54 | 0001000100001000 | 1 | 3 |
| 0x55 | 0000100100001000 | 1 | 3 |

FIG. 7 {
| | | | |
|---|---|---|---|
| 0x56 | 0010000010001000 | 1 | 3 |
| 0x57 | 0001000010001000 | 1 | 3 |
| 0x58 | 0000100010001000 | 1 | 3 |
| 0x59 | 0000010010001000 | 1 | 3 |
| 0x5a | 0010000001001000 | 1 | 3 |
| 0x5b | 0001000001001000 | 1 | 3 |
| 0x5c | 0000100001001000 | 1 | 3 |
| 0x5d | 0000010001001000 | 1 | 3 |
| 0x5e | 0000001001001000 | 1 | 3 |
| 0x5f | 0010010000000100 | 1 | 3 |
| 0x60 | 0010001000000100 | 1 | 3 |
| 0x61 | 0001001000000100 | 1 | 3 |
| 0x62 | 0010000100000100 | 1 | 3 |
| 0x63 | 0001000100000100 | 1 | 3 |
| 0x64 | 0000100100000100 | 1 | 3 |
| 0x65 | 0010000010000100 | 1 | 3 |
| 0x66 | 0001000010000100 | 1 | 3 |
| 0x67 | 0000100010000100 | 1 | 3 |
| 0x68 | 0000010010000100 | 1 | 3 |
| 0x69 | 0010000001000100 | 1 | 3 |
| 0x6a | 0001000001000100 | 1 | 3 |
| 0x6b | 0000100001000100 | 1 | 3 |
| 0x6c | 0000010001000100 | 1 | 3 |
| 0x6d | 0000001001000100 | 1 | 3 |
| 0x6e | 0010000000100100 | 1 | 3 |
| 0x6f | 0001000000100100 | 1 | 3 |
| 0x70 | 0000100000100100 | 1 | 3 |
| 0x71 | 0000010000100100 | 1 | 3 |
| 0x72 | 0000001000100100 | 1 | 3 |
| 0x73 | 0000000100100100 | 1 | 3 |
| 0x74 | 0010010000000010 | 2 | 3 |
| 0x75 | 0010001000000010 | 2 | 3 |
| 0x76 | 0001001000000010 | 2 | 3 |
| 0x77 | 0010000100000010 | 2 | 3 |
| 0x78 | 0001000100000010 | 2 | 3 |
| 0x79 | 0000100100000010 | 2 | 3 |
| 0x7a | 0010000010000010 | 2 | 3 |
| 0x7b | 0001000010000010 | 2 | 3 |
| 0x7c | 0000100010000010 | 2 | 3 |
| 0x7d | 0000010010000010 | 2 | 3 |
| 0x7e | 0010000001000010 | 2 | 3 |
| 0x7f | 0001000001000010 | 2 | 3 |
| 0x80 | 0000100001000010 | 2 | 3 |
| 0x81 | 0000010001000010 | 2 | 3 |
| 0x82 | 0000001001000010 | 2 | 3 |
| 0x83 | 0010000000100010 | 2 | 3 |
| 0x84 | 0001000000100010 | 2 | 3 |
| 0x85 | 0000100000100010 | 2 | 3 |
| 0x86 | 0000010000100010 | 2 | 3 |
| 0x87 | 0000001000100010 | 2 | 3 |
| 0x88 | 0000000100100010 | 2 | 3 |
| 0x89 | 0010000000010010 | 2 | 3 |
| 0x8a | 0001000000010010 | 2 | 3 |
| 0x8b | 0000100000010010 | 2 | 3 |
| 0x8c | 0000010000010010 | 2 | 3 |
| 0x8d | 0000001000010010 | 2 | 3 |
| 0x8e | 0000000100010010 | 2 | 3 |
| 0x8f | 0000000010010010 | 2 | 3 |
| 0x90 | 0010010000000001 | 2 | 3 |
| 0x91 | 0010001000000001 | 2 | 3 |
| 0x92 | 0001001000000001 | 2 | 3 |
| 0x93 | 0010000100000001 | 2 | 3 |
| 0x94 | 0001000100000001 | 2 | 3 |
| 0x95 | 0000100100000001 | 2 | 3 |
| 0x96 | 0010000010000001 | 2 | 3 |
| 0x97 | 0001000010000001 | 2 | 3 |
| 0x98 | 0000100010000001 | 2 | 3 |
| 0x99 | 0000010010000001 | 2 | 3 |
| 0x9a | 0010000001000001 | 2 | 3 |
| 0x9b | 0001000001000001 | 2 | 3 |
| 0x9c | 0000100001000001 | 2 | 3 |
| 0x9d | 0000010001000001 | 2 | 3 |
| 0x9e | 0000001001000001 | 2 | 3 |
| 0x9f | 0010000000100001 | 2 | 3 |
| 0xa0 | 0001000000100001 | 2 | 3 |
| 0xa1 | 0000100000100001 | 2 | 3 |
| 0xa2 | 0000010000100001 | 2 | 3 |
| 0xa3 | 0000001000100001 | 2 | 3 |
| 0xa4 | 0000000100100001 | 2 | 3 |
| 0xa5 | 0010000000010001 | 2 | 3 |
| 0xa6 | 0001000000010001 | 2 | 3 |
| 0xa7 | 0000100000010001 | 2 | 3 |
| 0xa8 | 0000010000010001 | 2 | 3 |
| 0xa9 | 0000001000010001 | 2 | 3 |
| 0xaa | 0000000100010001 | 2 | 3 |
| 0xab | 0000000010010001 | 2 | 3 |

FIG. 8

| | | | |
|---|---|---|---|
| 0xac | 0010000000001001 | 2 | 3 |
| 0xad | 0001000000001001 | 2 | 3 |
| 0xae | 0000100000001001 | 2 | 3 |
| 0xaf | 0000010000001001 | 2 | 3 |
| 0xb0 | 0000001000001001 | 2 | 3 |
| 0xb1 | 0000000100001001 | 2 | 3 |
| 0xb2 | 0000000010001001 | 2 | 3 |
| 0xb3 | 0000000001001001 | 2 | 3 |
| 0xb4 | 0010010010010000 | 1 | 4 |
| 0xb5 | 0010010010001000 | 1 | 4 |
| 0xb6 | 0010010001001000 | 1 | 4 |
| 0xb7 | 0010001001001000 | 1 | 4 |
| 0xb8 | 0001001001001000 | 1 | 4 |
| 0xb9 | 0010010010000100 | 1 | 4 |
| 0xba | 0010010001000100 | 1 | 4 |
| 0xbb | 0010001001000100 | 1 | 4 |
| 0xbc | 0001001001000100 | 1 | 4 |
| 0xbd | 0010010000100100 | 1 | 4 |
| 0xbe | 0010001000100100 | 1 | 4 |
| 0xbf | 0001001000100100 | 1 | 4 |
| 0xc0 | 0010000100100100 | 1 | 4 |
| 0xc1 | 0001000100100100 | 1 | 4 |
| 0xc2 | 0000100100100100 | 1 | 4 |
| 0xc3 | 0010010010000010 | 2 | 4 |
| 0xc4 | 0010010001000010 | 2 | 4 |
| 0xc5 | 0010001001000010 | 2 | 4 |
| 0xc6 | 0001001001000010 | 2 | 4 |
| 0xc7 | 0010010000100010 | 2 | 4 |
| 0xc8 | 0010001000100010 | 2 | 4 |
| 0xc9 | 0001001000100010 | 2 | 4 |
| 0xca | 0010000100100010 | 2 | 4 |
| 0xcb | 0001000100100010 | 2 | 4 |
| 0xcc | 0000100100100010 | 2 | 4 |
| 0xcd | 0010010000010010 | 2 | 4 |
| 0xce | 0010001000010010 | 2 | 4 |
| 0xcf | 0001001000010010 | 2 | 4 |
| 0xd0 | 0010000100010010 | 2 | 4 |
| 0xd1 | 0001000100010010 | 2 | 4 |
| 0xd2 | 0000100100010010 | 2 | 4 |
| 0xd3 | 0010000010010010 | 2 | 4 |
| 0xd4 | 0001000010010010 | 2 | 4 |
| 0xd5 | 0000100010010010 | 2 | 4 |
| 0xd6 | 0000010010010010 | 2 | 4 |
| 0xd7 | 0010010010000001 | 2 | 4 |
| 0xd8 | 0010010001000001 | 2 | 4 |
| 0xd9 | 0010001001000001 | 2 | 4 |
| 0xda | 0001001001000001 | 2 | 4 |
| 0xdb | 0010010000100001 | 2 | 4 |
| 0xdc | 0010001000100001 | 2 | 4 |
| 0xdd | 0001001000100001 | 2 | 4 |
| 0xde | 0010000100100001 | 2 | 4 |
| 0xdf | 0001000100100001 | 2 | 4 |
| 0xe0 | 0000100100100001 | 2 | 4 |
| 0xe1 | 0010010000010001 | 2 | 4 |
| 0xe2 | 0010001000010001 | 2 | 4 |
| 0xe3 | 0001001000010001 | 2 | 4 |
| 0xe4 | 0010000100010001 | 2 | 4 |
| 0xe5 | 0001000100010001 | 2 | 4 |
| 0xe6 | 0000100100010001 | 2 | 4 |
| 0xe7 | 0010000010010001 | 2 | 4 |
| 0xe8 | 0001000010010001 | 2 | 4 |
| 0xe9 | 0000100010010001 | 2 | 4 |
| 0xea | 0000010010010001 | 2 | 4 |
| 0xeb | 0010010000001001 | 2 | 4 |
| 0xec | 0010001000001001 | 2 | 4 |
| 0xed | 0001001000001001 | 2 | 4 |
| 0xee | 0010000100001001 | 2 | 4 |
| 0xef | 0001000100001001 | 2 | 4 |
| 0xf0 | 0000100100001001 | 2 | 4 |
| 0xf1 | 0010000010001001 | 2 | 4 |
| 0xf2 | 0001000010001001 | 2 | 4 |
| 0xf3 | 0000100010001001 | 2 | 4 |
| 0xf4 | 0000010010001001 | 2 | 4 |
| 0xf5 | 0010000001001001 | 2 | 4 |
| 0xf6 | 0001000001001001 | 2 | 4 |
| 0xf7 | 0000100001001001 | 2 | 4 |
| 0xf8 | 0000010001001001 | 2 | 4 |
| 0xf9 | 0000001001001001 | 2 | 4 |
| 0xfa | 0010010010010010 | 2 | 5 |
| 0xfb | 0010010010010001 | 2 | 5 |
| 0xfc | 0010010010001001 | 2 | 5 |
| 0xfd | 0010010001001001 | 2 | 5 |
| 0xfe | 0010001001001001 | 2 | 5 |
| 0xff | 0001001001001001 | 2 | 5 |

FIG. 11

| t | DATA WORD | S1 OR S2 | CODE WORD | State | Occ |
|---|---|---|---|---|---|
| 0 | 0x05 | 1 | 0100000001001001 | 2 | 4 |
| 1 | 0xfa | 2 | 0010010010010010 | 2 | 5 |
| 2 | 0xf8 | 1 | 0000010001001001 | 2 | 4 |
| 3 | 0xdf | 1 | 0000100100100001 | 2 | 4 |
| 4 | 0x71 | 2 | 0000010000100100 | 1 | 3 |
| 5 | 0xeb | 1 | 0100000010000001 | 2 | 3 |
| ... | ... | ... | ... | ... | ... |

FIG. 13

| t | DATA WORD | S1 OR S2 | CODE WORD | Occ | CONNECTION CONDITION |
|---|---|---|---|---|---|
| 0 | 0x05 | 1 | 01000000100101001 | 4 | CONDITION 2 |
| 1 | 0xfa | 2 | 00100100100010010 | 5 | CONDITION 3 |
| 2 | 0xf8 | 1 | 01000000010000000 | 2 | CONDITION 3 |
| 3 | 0xdf | 1 | 01000000000100010 | 3 | CONDITION 2 |
| 4 | 0x71 | 2 | 00000010000100100 | 3 | CONDITION 3 |
| 5 | 0xeb | 1 | 01000000010000001 | 3 | |
| ... | ... | ... | ... | ... | ... |

FIG. 17

```
S1 Code Table
Data      Code                                      State   Occ
0x0       10001000010001001000010010001 00            1      8
0x1       10010000010001001000010010001 00            1      8
0x2       01000100100001001000010010001 00            1      8
0x3       10000100100001001000010010001 00            1      8
0x4       01001000100001001000010010001 00            1      8
0x5       10001000100001001000010010001 00            1      8
0x6       10010000100001001000010010001 00            1      8
0x7       01001001000001001000010010001 00            1      8
0x8       10001001000001001000010010001 00            1      8
0x9       10010001000001001000010010001 00            1      8
0xa       10010010000001001000010010001 00            1      8
0xb       01000100100010001000010010001 00            1      8
0xc       10000100100010001000010010001 00            1      8
0xd       01001000100010001000010010001 00            1      8
0xe       10001000100010001000010010001 00            1      8
0xf       01001001000010001000010010001 00            1      8
0x10      10001001000010001000010010001 00            1      8
0x11      10010001000010001000010010001 00            1      8
0x12      01000100010010001000010010001 00            1      8
0x13      10000100010010001000010010001 00            1      8
0x14      01001000010010001000010010001 00            1      8
0x15      10001000010010001000010010001 00            1      8
0x16      10010000010010001000010010001 00            1      8
0x17      01001001000100001000010010001 00            1      8
0x18      10001001000100001000010010001 00            1      8
0x19      10010001000100001000010010001 00            1      8
0x1a      10010010000100001000010010001 00            1      8
0x1b      01000100100010000100010010001 00            1      8
0x1c      10000100100010000100010010001 00            1      8
0x1d      01001000100010000100010010001 00            1      8
0x1e      10001000100010000100010010001 00            1      8
0x1f      10010000100010000100010010001 00            1      8
0x20      01001000100001000100010010001 00            1      8
0x21      10001000100001000100010010001 00            1      8
0x22      10001000100001000100010010001 00            1      8
0x23      10010010000100000100010010001 00            1      8
0x24      01001001000010000100010010001 00            1      8
0x25      10001001000010000100010010001 00            1      8
0x26      10010001000010000100010010001 00            1      8
0x27      10010010000100000100010010001 00            1      8
0x28      10010010010000000100010010001 00            1      8
0x29      01000010010010010000010010001 00            1      8
0x2a      10000010010010010000010010001 00            1      8
0x2b      01000100010010010000010010001 00            1      8
0x2c      10000100010010010000010010001 00            1      8
0x2d      01001000010010010000010010001 00            1      8
0x2e      10001000010010010000010010001 00            1      8
0x2f      10010000010010010000010010001 00            1      8
0x30      01001001000010010000010010001 00            1      8
0x31      10001001000010010000010010001 00            1      8
          OMITTED
0xe38     01001001001001001001001000000 00            1      8
0xe39     10001001001001001001001000000 00            1      8
0xe3a     10010001001001001001001000000 00            1      8
0xe3b     10010010001001001001001000000 00            1      8
0xe3c     10010010010001001001001000000 00            1      8
```

FIG. 18

| | | | |
|---|---|---|---|
| 0xe3d | 1001001001001000100100100000000 | 1 | 8 |
| 0xe3e | 1001001001001001000100100000000 | 1 | 8 |
| 0xe3f | 1001001001001001001000100000000 | 1 | 8 |
| 0xe40 | 1001001001001001001001000000000 | 1 | 8 |
| 0xe41 | 0100000000001000001001001001001 | 2 | 7 |
| 0xe42 | 0100000000010000001001001001001 | 2 | 7 |
| 0xe43 | 1000000000010000001001001001001 | 2 | 7 |
| 0xe44 | 0100000000100000001001001001001 | 2 | 7 |
| 0xe45 | 1000000000100000001001001001001 | 2 | 7 |
| 0xe46 | 0100000001000000001001001001001 | 2 | 7 |
| 0xe47 | 1000000001000000001001001001001 | 2 | 7 |
| 0xe48 | 0100000010000000001001001001001 | 2 | 7 |
| 0xe49 | 1000000010000000001001001001001 | 2 | 7 |
| 0xe4a | 0100000100000000001001001001001 | 2 | 7 |
| 0xe4b | 1000000100000000001001001001001 | 2 | 7 |
| 0xe4c | 0100000000001000010001001001001 | 2 | 7 |
| 0xe4d | 0100000000010000010001001001001 | 2 | 7 |
| 0xe4e | 1000000000010000010001001001001 | 2 | 7 |
| 0xe4f | 0100000000100000010001001001001 | 2 | 7 |
| 0xe50 | 1000000000100000010001001001001 | 2 | 7 |
| 0xe51 | 0100000001000000010001001001001 | 2 | 7 |
| 0xe52 | 1000000001000000010001001001001 | 2 | 7 |
| 0xe53 | 0100000010000000010001001001001 | 2 | 7 |
| 0xe54 | 1000000010000000010001001001001 | 2 | 7 |
| 0xe55 | 0100000100000000010001001001001 | 2 | 7 |
| 0xe56 | 1000000100000000010001001001001 | 2 | 7 |
| 0xe57 | 0100001000000000010001001001001 | 2 | 7 |
| 0xe58 | 1000001000000000010001001001001 | 2 | 7 |
| 0xe59 | 0100000000001000100001001001001 | 2 | 7 |
| 0xe5a | 0100000000010000100001001001001 | 2 | 7 |
| 0xe5b | 1000000000010000100001001001001 | 2 | 7 |
| 0xe5c | 0100000000100000100001001001001 | 2 | 7 |
| 0xe5d | 1000000000100000100001001001001 | 2 | 7 |
| 0xe5e | 0100000001000000100001001001001 | 2 | 7 |
| 0xe5f | 1000000001000000100001001001001 | 2 | 7 |
| 0xe60 | 0100000010000000100001001001001 | 2 | 7 |
| 0xe61 | 1000000010000000100001001001001 | 2 | 7 |
| 0xe62 | 0100000100000000100001001001001 | 2 | 7 |
| 0xe63 | 1000000100000000100001001001001 | 2 | 7 |
| 0xe64 | 0100001000000000100001001001001 | 2 | 7 |
| 0xe65 | 1000001000000000100001001001001 | 2 | 7 |
| 0xe66 | 0100010000000000100001001001001 | 2 | 7 |
| 0xe67 | 1000010000000000100001001001001 | 2 | 7 |
| 0xe68 | 0100000000001001000001001001001 | 2 | 7 |
| 0xe69 | 0100000000010001000001001001001 | 2 | 7 |
| | OMITTED | | |
| 0xffcf | 0100001000000100000001000000000 | 1 | 4 |
| 0xffd0 | 1000001000000100000001000000000 | 1 | 4 |
| 0xffd1 | 0100010000000100000001000000000 | 1 | 4 |
| 0xffd2 | 1000010000000100000001000000000 | 1 | 4 |
| 0xffd3 | 0100100000000100000001000000000 | 1 | 4 |
| 0xffd4 | 1000100000000100000001000000000 | 1 | 4 |
| 0xffd5 | 1001000000000100000001000000000 | 1 | 4 |
| 0xffd6 | 0100000001001000000001000000000 | 1 | 4 |
| 0xffd7 | 1000000001001000000001000000000 | 1 | 4 |
| 0xffd8 | 0100000010001000000001000000000 | 1 | 4 |
| 0xffd9 | 1000000010001000000001000000000 | 1 | 4 |
| 0xffda | 0100000100001000000001000000000 | 1 | 4 |
| 0xffdb | 1000000100001000000001000000000 | 1 | 4 |
| 0xffdc | 0100001000001000000001000000000 | 1 | 4 |
| 0xffdd | 1000001000001000000001000000000 | 1 | 4 |

FIG. 19

| | | | |
|---|---|---|---|
| 0xffde | 0100010000001000000001000000000 | 1 | 4 |
| 0xffdf | 1000010000001000000001000000000 | 1 | 4 |
| 0xffe0 | 0100100000001000000001000000000 | 1 | 4 |
| 0xffe1 | 1000100000001000000001000000000 | 1 | 4 |
| 0xffe2 | 1001000000001000000001000000000 | 1 | 4 |
| 0xffe3 | 0100000100010000000001000000000 | 1 | 4 |
| 0xffe4 | 1000000100010000000001000000000 | 1 | 4 |
| 0xffe5 | 0100000100010000000001000000000 | 1 | 4 |
| 0xffe6 | 1000000100010000000001000000000 | 1 | 4 |
| 0xffe7 | 0100001000010000000001000000000 | 1 | 4 |
| 0xffe8 | 1000001000010000000001000000000 | 1 | 4 |
| 0xffe9 | 0100010000010000000001000000000 | 1 | 4 |
| 0xffea | 1000010000010000000001000000000 | 1 | 4 |
| 0xffeb | 0100100000010000000001000000000 | 1 | 4 |
| 0xffec | 1000100000010000000001000000000 | 1 | 4 |
| 0xffed | 1001000000010000000001000000000 | 1 | 4 |
| 0xffee | 0100000100100000000001000000000 | 1 | 4 |
| 0xffef | 1000000100100000000001000000000 | 1 | 4 |
| 0xfff0 | 0100001000100000000001000000000 | 1 | 4 |
| 0xfff1 | 1000001000100000000001000000000 | 1 | 4 |
| 0xfff2 | 0100010000100000000001000000000 | 1 | 4 |
| 0xfff3 | 1000010000100000000001000000000 | 1 | 4 |
| 0xfff4 | 0100100000100000000001000000000 | 1 | 4 |
| 0xfff5 | 1000100000100000000001000000000 | 1 | 4 |
| 0xfff6 | 1001000000100000000001000000000 | 1 | 4 |
| 0xfff7 | 0100000000001000000000010000000 | 1 | 3 |
| 0xfff8 | 0100000000001000000000100000000 | 1 | 3 |
| 0xfff9 | 0100000000001000000000100000000 | 1 | 3 |
| 0xfffa | 1000000000001000000000100000000 | 1 | 3 |
| 0xfffb | 0100000000001000000001000000000 | 1 | 3 |
| 0xfffc | 0100000000001000000001000000000 | 1 | 3 |
| 0xfffd | 1000000000001000000001000000000 | 1 | 3 |
| 0xfffe | 0100000000010000000001000000000 | 1 | 3 |
| 0xffff | 1000000000010000000001000000000 | 1 | 3 |

FIG. 20

| | S2 Code Table | | |
|---|---|---|---|
| Data | Code | State | Occ |
| 0x0 | 00100000001000000000001000000000 | 1 | 3 |
| 0x1 | 00010000001000000000001000000000 | 1 | 3 |
| 0x2 | 00001000001000000000001000000000 | 1 | 3 |
| 0x3 | 00000100001000000000001000000000 | 1 | 3 |
| 0x4 | 00000010001000000000001000000000 | 1 | 3 |
| 0x5 | 00000001001000000000001000000000 | 1 | 3 |
| 0x6 | 00100000000100000000001000000000 | 1 | 3 |
| 0x7 | 00010000000100000000001000000000 | 1 | 3 |
| 0x8 | 00001000000100000000001000000000 | 1 | 3 |
| 0x9 | 00000100000100000000001000000000 | 1 | 3 |
| 0xa | 00000010000100000000001000000000 | 1 | 3 |
| 0xb | 00000001000100000000001000000000 | 1 | 3 |
| 0xc | 00000000100100000000001000000000 | 1 | 3 |
| 0xd | 00100000000010000000001000000000 | 1 | 3 |
| 0xe | 00010000000010000000001000000000 | 1 | 3 |
| 0xf | 00001000000010000000001000000000 | 1 | 3 |
| 0x10 | 00000100000010000000001000000000 | 1 | 3 |
| 0x11 | 00000010000010000000001000000000 | 1 | 3 |
| 0x12 | 00000001000010000000001000000000 | 1 | 3 |
| 0x13 | 00000000100010000000001000000000 | 1 | 3 |
| 0x14 | 00000000010010000000001000000000 | 1 | 3 |
| 0x15 | 00100000000001000000001000000000 | 1 | 3 |
| 0x16 | 00010000000001000000001000000000 | 1 | 3 |
| 0x17 | 00001000000001000000001000000000 | 1 | 3 |
| 0x18 | 00000100000001000000001000000000 | 1 | 3 |
| 0x19 | 00000010000001000000001000000000 | 1 | 3 |
| 0x1a | 00000001000001000000001000000000 | 1 | 3 |
| 0x1b | 00000000100001000000001000000000 | 1 | 3 |
| 0x1c | 00000000010001000000001000000000 | 1 | 3 |
| 0x1d | 00010000000001000000001000000000 | 1 | 3 |
| 0x1e | 00001000000001000000001000000000 | 1 | 3 |
| 0x1f | 00000100000001000000001000000000 | 1 | 3 |
| 0x20 | 00000010000000100000001000000000 | 1 | 3 |
| 0x21 | 00000001000000100000001000000000 | 1 | 3 |
| 0x22 | 00000000100000100000001000000000 | 1 | 3 |
| 0x23 | 00000000010000100000001000000000 | 1 | 3 |
| 0x24 | 00001000000000010000001000000000 | 1 | 3 |
| 0x25 | 00000100000000010000001000000000 | 1 | 3 |
| 0x26 | 00000010000000010000001000000000 | 1 | 3 |
| 0x27 | 00000001000000010000001000000000 | 1 | 3 |
| 0x28 | 00000000100000010000001000000000 | 1 | 3 |
| 0x29 | 00000000010000010000001000000000 | 1 | 3 |
| 0x2a | 00000100000000001000001000000000 | 1 | 3 |
| 0x2b | 00000010000000001000001000000000 | 1 | 3 |
| 0x2c | 00000001000000001000001000000000 | 1 | 3 |
| 0x2d | 00000000100000001000001000000000 | 1 | 3 |
| 0x2e | 00000000010000001000001000000000 | 1 | 3 |
| 0x2f | 00000010000000000100001000000000 | 1 | 3 |
| 0x30 | 00000001000000000100001000000000 | 1 | 3 |
| 0x31 | 00000000100000000100001000000000 | 1 | 3 |
| | OMITTED | | |
| 0xd0c | 00000000100000000100000000100100 | 1 | 4 |
| 0xd0d | 00000000010000000100000000100100 | 1 | 4 |
| 0xd0e | 00000000100000000010000000100100 | 1 | 4 |
| 0xd0f | 00000000010000000010000000100100 | 1 | 4 |
| 0xd10 | 00000000001000000010000000100100 | 1 | 4 |

FIG. 21

| | | | |
|---|---|---|---|
| 0xd11 | 000000000100000000000100000100100 | 1 | 4 |
| 0xd12 | 000000000100000000000100000100100 | 1 | 4 |
| 0xd13 | 000000000100000000000010000100100 | 1 | 4 |
| 0xd14 | 001000010000000000001000000000010 | 2 | 4 |
| 0xd15 | 000100010000000000001000000000010 | 2 | 4 |
| 0xd16 | 000010010000000000001000000000010 | 2 | 4 |
| 0xd17 | 001000001000000000001000000000010 | 2 | 4 |
| 0xd18 | 000100001000000000001000000000010 | 2 | 4 |
| 0xd19 | 000010001000000000001000000000010 | 2 | 4 |
| 0xd1a | 000001001000000000001000000000010 | 2 | 4 |
| 0xd1b | 001000000100000000001000000000010 | 2 | 4 |
| 0xd1c | 000100000100000000001000000000010 | 2 | 4 |
| 0xd1d | 000010000100000000001000000000010 | 2 | 4 |
| 0xd1e | 000001000100000000001000000000010 | 2 | 4 |
| 0xd1f | 000000100100000000001000000000010 | 2 | 4 |
| 0xd20 | 001000000010000000001000000000010 | 2 | 4 |
| 0xd21 | 000100000010000000001000000000010 | 2 | 4 |
| 0xd22 | 000010000010000000001000000000010 | 2 | 4 |
| 0xd23 | 000001000010000000001000000000010 | 2 | 4 |
| 0xd24 | 000000100010000000001000000000010 | 2 | 4 |
| 0xd25 | 000000010010000000001000000000010 | 2 | 4 |
| 0xd26 | 001000000001000000001000000000010 | 2 | 4 |
| 0xd27 | 000100000001000000001000000000010 | 2 | 4 |
| 0xd28 | 000010000001000000001000000000010 | 2 | 4 |
| 0xd29 | 000001000001000000001000000000010 | 2 | 4 |
| 0xd2a | 000000100001000000001000000000010 | 2 | 4 |
| 0xd2b | 000000010001000000001000000000010 | 2 | 4 |
| 0xd2c | 000000001001000000001000000000010 | 2 | 4 |
| 0xd2d | 001000000000100000001000000000010 | 2 | 4 |
| 0xd2e | 000100000000100000001000000000010 | 2 | 4 |
| 0xd2f | 000010000000100000001000000000010 | 2 | 4 |
| 0xd30 | 000001000000100000001000000000010 | 2 | 4 |
| 0xd31 | 000000100000100000001000000000010 | 2 | 4 |
| 0xd32 | 000000010000100000001000000000010 | 2 | 4 |
| 0xd33 | 000000001000100000001000000000010 | 2 | 4 |
| 0xd34 | 000000000100100000001000000000010 | 2 | 4 |
| 0xd35 | 001000000000010000001000000000010 | 2 | 4 |
| 0xd36 | 000100000000010000001000000000010 | 2 | 4 |
| 0xd37 | 000010000000010000001000000000010 | 2 | 4 |
| 0xd38 | 000001000000010000001000000000010 | 2 | 4 |
| 0xd39 | 000000100000010000001000000000010 | 2 | 4 |
| 0xd3a | 000000010000010000001000000000010 | 2 | 4 |
| 0xd3b | 000000001000010000001000000000010 | 2 | 4 |
| 0xd3c | 000000000100010000001000000000010 | 2 | 4 |
| 0xd3d | 000100000000001000001000000000010 | 2 | 4 |
| | OMITTED | | |
| 0xffcf | 000100100100100100000100100100100 | 1 | 8 |
| 0xffd0 | 001001000100100100000100100100100 | 1 | 8 |
| 0xffd1 | 001000100100100100000100100100100 | 1 | 8 |
| 0xffd2 | 000100100100100100000100100100100 | 1 | 8 |
| 0xffd3 | 001000010100100100000100100100100 | 1 | 8 |
| 0xffd4 | 000100010100100100000100100100100 | 1 | 8 |
| 0xffd5 | 000010010100100100000100100100100 | 1 | 8 |
| 0xffd6 | 001001001001000010000100100100100 | 1 | 8 |
| 0xffd7 | 001001001000100010000100100100100 | 1 | 8 |
| 0xffd8 | 001001000100100010000100100100100 | 1 | 8 |
| 0xffd9 | 001001001001000010000100100100100 | 1 | 8 |
| 0xffda | 000100100100100010000100100100100 | 1 | 8 |
| 0xffdb | 001001000100000010000100100100100 | 1 | 8 |
| 0xffdc | 001001000100100010000100100100100 | 1 | 8 |
| 0xffdd | 001000100100100010000100100100100 | 1 | 8 |

FIG. 26

S1 Code Table (occurrence descendant order 65536 in 118586)

| Data | Code | State | Occ | beg_z | end_z |
|---|---|---|---|---|---|
| 0x0 | 00100010001000000000100000000000010001 | 2 | 6 | 2 | 0 |
| 0x1 | 01000010001000000000100000000000010001 | 2 | 6 | 1 | 0 |
| 0x2 | 10000010001000000000100000000000010001 | 2 | 6 | 0 | 0 |
| 0x3 | 01000100001000000000100000000000010001 | 2 | 6 | 1 | 0 |
| 0x4 | 10000100001000000000100000000000010001 | 2 | 6 | 0 | 0 |
| 0x5 | 10001000001000000000100000000000010001 | 2 | 6 | 0 | 0 |
| 0x6 | 01000100001000000000100000000000010001 | 2 | 6 | 1 | 0 |
| 0x7 | 10000100001000000000100000000000010001 | 2 | 6 | 0 | 0 |
| 0x8 | 10001000001000000000100000000000010001 | 2 | 6 | 0 | 0 |
| 0x9 | 10001000100000000000100000000000010001 | 2 | 6 | 0 | 0 |
| 0xa | 00100000001000100010000000000000010001 | 2 | 6 | 2 | 0 |
| 0xb | 01000000001000100010000000000000010001 | 2 | 6 | 1 | 0 |
| 0xc | 10000000001000100010000000000000010001 | 2 | 6 | 0 | 0 |
| 0xd | 00100000010000100010000000000000010001 | 2 | 6 | 2 | 0 |
| 0xe | 01000000010000100010000000000000010001 | 2 | 6 | 1 | 0 |
| 0xf | 10000000010000100010000000000000010001 | 2 | 6 | 0 | 0 |
| 0x10 | 00100000100000100010000000000000010001 | 2 | 6 | 2 | 0 |
| 0x11 | 01000000100000100010000000000000010001 | 2 | 6 | 1 | 0 |
| 0x12 | 10000000100000100010000000000000010001 | 2 | 6 | 0 | 0 |
| 0x13 | 00100001000000100010000000000000010001 | 2 | 6 | 2 | 0 |
| 0x14 | 01000001000000100010000000000000010001 | 2 | 6 | 1 | 0 |
| 0x15 | 10000001000000100010000000000000010001 | 2 | 6 | 0 | 0 |
| 0x16 | 00100010000000100010000000000000010001 | 2 | 6 | 2 | 0 |
| 0x17 | 01000010000000100010000000000000010001 | 2 | 6 | 1 | 0 |
| 0x18 | 10000010000000100010000000000000010001 | 2 | 6 | 0 | 0 |
| 0x19 | 00100010000001000010000000000000010001 | 2 | 6 | 2 | 0 |
| 0x1a | 01000010000001000010000000000000010001 | 2 | 6 | 1 | 0 |
| 0x1b | 10000010000001000010000000000000010001 | 2 | 6 | 0 | 0 |
| 0x1c | 01000100000001000010000000000000010001 | 2 | 6 | 1 | 0 |
| 0x1d | 10000100000001000010000000000000010001 | 2 | 6 | 0 | 0 |
| 0x1e | 10001000000001000010000000000000010001 | 2 | 6 | 0 | 0 |
| 0x1f | 00100000001000100001000000000000010001 | 2 | 6 | 2 | 0 |
| 0x20 | 01000000001000100001000000000000010001 | 2 | 6 | 1 | 0 |
| 0x21 | 10000000001000100001000000000000010001 | 2 | 6 | 0 | 0 |
| 0x22 | 00100000010000100001000000000000010001 | 2 | 6 | 2 | 0 |
| 0x23 | 01000000010000100001000000000000010001 | 2 | 6 | 1 | 0 |
| 0x24 | 10000000010000100001000000000000010001 | 2 | 6 | 0 | 0 |
| 0x25 | 00100000100000100001000000000000010001 | 2 | 6 | 2 | 0 |
| 0x26 | 01000000100000100001000000000000010001 | 2 | 6 | 1 | 0 |
| 0x27 | 10000000100000100001000000000000010001 | 2 | 6 | 0 | 0 |
| 0x28 | 00100001000000100001000000000000010001 | 2 | 6 | 2 | 0 |
| 0x29 | 01000001000000100001000000000000010001 | 2 | 6 | 1 | 0 |
| 0x2a | 10000001000000100001000000000000010001 | 2 | 6 | 0 | 0 |
| 0x2b | 00100010000000100001000000000000010001 | 2 | 6 | 2 | 0 |
| 0x2c | 01000010000000100001000000000000010001 | 2 | 6 | 1 | 0 |
| 0x2d | 10000010000000100001000000000000010001 | 2 | 6 | 0 | 0 |
| 0x2e | 01000100000000100001000000000000010001 | 2 | 6 | 1 | 0 |
| 0x2f | 10000100000000100001000000000000010001 | 2 | 6 | 0 | 0 |
| 0x30 | 10001000000000100001000000000000010001 | 2 | 6 | 0 | 0 |
| ... | OMITTED | | | | |
| 0xffce | 10000010000100000000000001000000000000 | 1 | 4 | 0 | 11 |
| 0xffcf | 01000100001000000000000001000000000000 | 1 | 4 | 1 | 11 |
| 0xffd0 | 10000100001000000000000001000000000000 | 1 | 4 | 0 | 11 |
| 0xffd1 | 10001000001000000000000001000000000000 | 1 | 4 | 0 | 11 |
| 0xffd2 | 00100000000000100000000000001000000000 | 1 | 3 | 2 | 6 |
| 0xffd3 | 00100000000000010000000000010000000000 | 1 | 3 | 2 | 7 |
| 0xffd4 | 00100000000000100000000000010000000000 | 1 | 3 | 2 | 7 |
| 0xffd5 | 01000000000000100000000000010000000000 | 1 | 3 | 1 | 7 |
| 0xffd6 | 00100000000000100000000000100000000000 | 1 | 3 | 2 | 8 |
| 0xffd7 | 00100000000000010000000000100000000000 | 1 | 3 | 2 | 8 |
| 0xffd8 | 01000000000000100000000000100000000000 | 1 | 3 | 1 | 8 |
| 0xffd9 | 00100000000001000000000000100000000000 | 1 | 3 | 2 | 8 |
| 0xffda | 01000000000001000000000000100000000000 | 1 | 3 | 1 | 8 |
| 0xffdb | 10000000000001000000000000100000000000 | 1 | 3 | 0 | 8 |
| 0xffdc | 00100000000001000000000001000000000000 | 1 | 3 | 2 | 9 |
| 0xffdd | 00100000000000010000000001000000000000 | 1 | 3 | 2 | 9 |
| 0xffde | 01000000000000010000000001000000000000 | 1 | 3 | 1 | 9 |

FIG. 27

| | | | | | |
|---|---|---|---|---|---|
| 0xffdf | 001000000000001000000000000100000000 | 1 | 3 | 2 | 9 |
| 0xffe0 | 010000000000001000000000000100000000 | 1 | 3 | 1 | 9 |
| 0xffe1 | 100000000000001000000000000100000000 | 1 | 3 | 0 | 9 |
| 0xffe2 | 001000000000001000000000000100000000 | 1 | 3 | 2 | 9 |
| 0xffe3 | 010000000000001000000000000100000000 | 1 | 3 | 1 | 9 |
| 0xffe4 | 100000000000001000000000000100000000 | 1 | 3 | 0 | 9 |
| 0xffe5 | 001000000000000100000000001000000000 | 1 | 3 | 2 | 10 |
| 0xffe6 | 001000000000001000000000010000000000 | 1 | 3 | 2 | 10 |
| 0xffe7 | 010000000000001000000000010000000000 | 1 | 3 | 1 | 10 |
| 0xffe8 | 001000000000001000000000010000000000 | 1 | 3 | 2 | 10 |
| 0xffe9 | 010000000000001000000000010000000000 | 1 | 3 | 1 | 10 |
| 0xffea | 100000000000001000000000010000000000 | 1 | 3 | 0 | 10 |
| 0xffeb | 001000000000001000000000010000000000 | 1 | 3 | 2 | 10 |
| 0xffec | 010000000000001000000000010000000000 | 1 | 3 | 1 | 10 |
| 0xffed | 100000000000001000000000010000000000 | 1 | 3 | 0 | 10 |
| 0xffee | 001000000001000000000000010000000000 | 1 | 3 | 2 | 10 |
| 0xffef | 010000000001000000000000010000000000 | 1 | 3 | 1 | 10 |
| 0xfff0 | 100000000001000000000000010000000000 | 1 | 3 | 0 | 10 |
| 0xfff1 | 001000000000000010000000100000000000 | 1 | 3 | 2 | 11 |
| 0xfff2 | 001000000000001000000000100000000000 | 1 | 3 | 2 | 11 |
| 0xfff3 | 010000000000001000000000100000000000 | 1 | 3 | 1 | 11 |
| 0xfff4 | 001000000000001000000000100000000000 | 1 | 3 | 2 | 11 |
| 0xfff5 | 010000000000001000000000100000000000 | 1 | 3 | 1 | 11 |
| 0xfff6 | 100000000000001000000000100000000000 | 1 | 3 | 0 | 11 |
| 0xfff7 | 001000000000010000000000100000000000 | 1 | 3 | 2 | 11 |
| 0xfff8 | 010000000000010000000000100000000000 | 1 | 3 | 1 | 11 |
| 0xfff9 | 100000000000010000000000100000000000 | 1 | 3 | 0 | 11 |
| 0xfffa | 001000000001000000000000100000000000 | 1 | 3 | 2 | 11 |
| 0xfffb | 010000000001000000000000100000000000 | 1 | 3 | 1 | 11 |
| 0xfffc | 100000000001000000000000100000000000 | 1 | 3 | 0 | 11 |
| 0xfffd | 001000000001000000000000100000000000 | 1 | 3 | 2 | 11 |
| 0xfffe | 010000000001000000000000100000000000 | 1 | 3 | 1 | 11 |
| 0xffff | 100000000001000000000000100000000000 | 1 | 3 | 0 | 11 |

FIG. 28

S2 Code Table (occurrence asscendant order 65536 in 70161)

| Data | Code | State | Occ | beg_z | end_z |
|---|---|---|---|---|---|
| 0x0 | 00000000001000000000000100000000000 | 1 | 2 | 11 | 11 |
| 0x1 | 00010000001000000000000100000000000 | 1 | 3 | 3 | 11 |
| 0x2 | 00001000001000000000000100000000000 | 1 | 3 | 4 | 11 |
| 0x3 | 00000100001000000000000100000000000 | 1 | 3 | 5 | 11 |
| 0x4 | 00000010001000000000000100000000000 | 1 | 3 | 6 | 11 |
| 0x5 | 00000001001000000000000100000000000 | 1 | 3 | 7 | 11 |
| 0x6 | 00010000000100000000000100000000000 | 1 | 3 | 3 | 11 |
| 0x7 | 00001000000100000000000100000000000 | 1 | 3 | 4 | 11 |
| 0x8 | 00000100000100000000000100000000000 | 1 | 3 | 5 | 11 |
| 0x9 | 00000010000100000000000100000000000 | 1 | 3 | 6 | 11 |
| 0xa | 00000001000100000000000100000000000 | 1 | 3 | 7 | 11 |
| 0xb | 00000000100100000000000100000000000 | 1 | 3 | 8 | 11 |
| 0xc | 00010000000010000000000100000000000 | 1 | 3 | 3 | 11 |
| 0xd | 00001000000010000000000100000000000 | 1 | 3 | 4 | 11 |
| 0xe | 00000100000010000000000100000000000 | 1 | 3 | 5 | 11 |
| 0xf | 00000010000010000000000100000000000 | 1 | 3 | 6 | 11 |
| 0x10 | 00000001000010000000000100000000000 | 1 | 3 | 7 | 11 |
| 0x11 | 00000000100010000000000100000000000 | 1 | 3 | 8 | 11 |
| 0x12 | 00000000010010000000000100000000000 | 1 | 3 | 9 | 11 |
| 0x13 | 00010000000001000000000100000000000 | 1 | 3 | 3 | 11 |
| 0x14 | 00001000000001000000000100000000000 | 1 | 3 | 4 | 11 |
| 0x15 | 00000100000001000000000100000000000 | 1 | 3 | 5 | 11 |
| 0x16 | 00000010000001000000000100000000000 | 1 | 3 | 6 | 11 |
| 0x17 | 00000001000001000000000100000000000 | 1 | 3 | 7 | 11 |
| 0x18 | 00000000100001000000000100000000000 | 1 | 3 | 8 | 11 |
| 0x19 | 00000000010001000000000100000000000 | 1 | 3 | 9 | 11 |
| 0x1a | 00000000001001000000000100000000000 | 1 | 3 | 10 | 11 |
| 0x1b | 00010000000000100000000100000000000 | 1 | 3 | 3 | 11 |
| 0x1c | 00001000000000100000000100000000000 | 1 | 3 | 4 | 11 |
| 0x1d | 00000100000000100000000100000000000 | 1 | 3 | 5 | 11 |
| 0x1e | 00000010000000100000000100000000000 | 1 | 3 | 6 | 11 |
| 0x1f | 00000001000000100000000100000000000 | 1 | 3 | 7 | 11 |
| 0x20 | 00000000100000100000000100000000000 | 1 | 3 | 8 | 11 |
| 0x21 | 00000000010000100000000100000000000 | 1 | 3 | 9 | 11 |
| 0x22 | 00000000001000100000000100000000000 | 1 | 3 | 10 | 11 |
| 0x23 | 00000000000100100000000100000000000 | 1 | 3 | 11 | 11 |
| 0x24 | 00010000000000010000000100000000000 | 1 | 3 | 3 | 11 |
| 0x25 | 00001000000000010000000100000000000 | 1 | 3 | 4 | 11 |
| 0x26 | 00000100000000010000000100000000000 | 1 | 3 | 5 | 11 |
| 0x27 | 00000010000000010000000100000000000 | 1 | 3 | 6 | 11 |
| 0x28 | 00000001000000010000000100000000000 | 1 | 3 | 7 | 11 |
| 0x29 | 00000000100000010000000100000000000 | 1 | 3 | 8 | 11 |
| 0x2a | 00000000010000010000000100000000000 | 1 | 3 | 9 | 11 |
| 0x2b | 00000000001000010000000100000000000 | 1 | 3 | 10 | 11 |
| 0x2c | 00000000000100010000000100000000000 | 1 | 3 | 11 | 11 |
| 0x2d | 00010000000000001000000100000000000 | 1 | 3 | 3 | 11 |
| 0x2e | 00001000000000001000000100000000000 | 1 | 3 | 4 | 11 |
| 0x2f | 00000100000000001000000100000000000 | 1 | 3 | 5 | 11 |
| 0x30 | 00000010000000001000000100000000000 | 1 | 3 | 6 | 11 |
| ... | OMITTED | | | | |
| 0xffcf | 00001000001000100000001000010000001 | 2 | 7 | 4 | 0 |
| 0xffd0 | 00000100001000100000001000010000001 | 2 | 7 | 5 | 0 |
| 0xffd1 | 00000010001000100000001000010000001 | 2 | 7 | 6 | 0 |
| 0xffd2 | 00000001001000100000001000010000001 | 2 | 7 | 7 | 0 |
| 0xffd3 | 00010001000000100000001000010000001 | 2 | 7 | 3 | 0 |
| 0xffd4 | 00010000100000100000001000010000001 | 2 | 7 | 3 | 0 |
| 0xffd5 | 00001000100000100000001000010000001 | 2 | 7 | 4 | 0 |
| 0xffd6 | 00010000010000100000001000010000001 | 2 | 7 | 3 | 0 |
| 0xffd7 | 00001000010000100000001000010000001 | 2 | 7 | 4 | 0 |
| 0xffd8 | 00000100010000100000001000010000001 | 2 | 7 | 5 | 0 |
| 0xffd9 | 00010000001000100000001000010000001 | 2 | 7 | 3 | 0 |
| 0xffda | 00001000001000100000001000010000001 | 2 | 7 | 4 | 0 |
| 0xffdb | 00000100001000100000001000010000001 | 2 | 7 | 5 | 0 |
| 0xffdc | 00000010001000100000001000010000001 | 2 | 7 | 6 | 0 |
| 0xffdd | 00010000000100100000001000010000001 | 2 | 7 | 3 | 0 |
| 0xffde | 00001000000100100000001000010000001 | 2 | 7 | 4 | 0 |
| 0xffdf | 00000100000100100000001000010000001 | 2 | 7 | 5 | 0 |

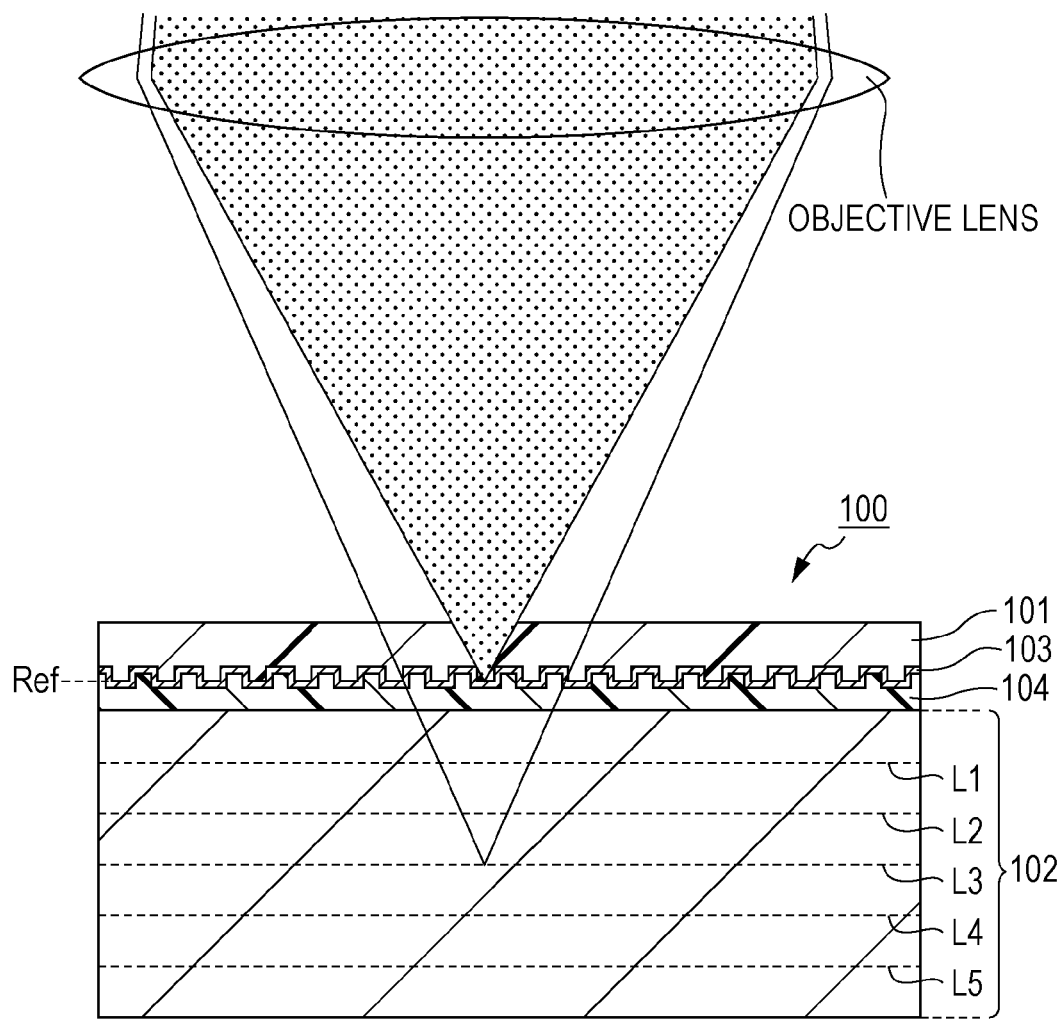

ENCODING APPARATUS AND METHOD, RECORDING APPARATUS AND METHOD, AND DECODING APPARATUS AND METHOD

CROSS REFERENCE TO RELATED APPLICATIONS

This application claims priority under 35 U.S.C. §119 to Japanese Priority Patent Application JP 2010-106591 filed in the Japan Patent Office on May 6, 2010, the entire contents of which are hereby incorporated by reference, and Japanese Priority Patent Application JP 2010-274548 filed in the Japan Patent Office on Dec. 9, 2010, the entire contents of which are hereby incorporated by reference.

BACKGROUND OF THE INVENTION

1. Field of the Invention

The present invention relates to an encoding apparatus and method for converting m-bit data words into n-bit code words. In addition, the present invention relates to a recording apparatus and method for recording a recording code string obtained by such encoding. Furthermore, the present invention relates to a decoding apparatus and method for decoding the recording code string.

2. Description of the Related Art

As an optical recording medium on or from which a signal is recorded or played back by radiating light, for example, so-called optical discs such as a compact disc (CD), a digital versatile disc (DVD), and a Blu-ray Disc (BD) (registered trademark) are widely used.

For these currently widely used optical discs, mark edge recording, in which recording codes are defined by non-return-to-zero inverting (NRZI) and converted into non-return-to-zero (NRZ) codes before the recording, is performed.

In addition, in optical discs, because a tracking error signal is obtained from grooves and pits, it is necessary for a recording code to have a small number of low-range components. That is, since a tracking servo band is located in a lower range than the signal band of a recording code, if the recording code has a large number of low-range components, the low-range components of the recording code may be superimposed on the tracking error signal, which deteriorates the tracking servo characteristics.

Therefore, in optical discs of the related art, the absolute value of a digital sum value (DSV) in an NRZ code string to be recorded is controlled such that the absolute value is small, thereby reducing the number of the low-range components of a recording code.

For example, in CDs, an eight-to-fourteen modulation (EFM) code is used and a coding method is adopted in which a minimum run length of d=2 is satisfied between a 14-bit code word and a next code word and a predetermined 3-bit connection bit that reduces the absolute value of a DSV in a code string is selected and inserted.

In addition, in DVDs, a modulation code called "EFM plus" is used and DSV control is performed by selecting a code word from a main table or from a substitute table for a certain data word, the selected code word being one with which the absolute value of a DSV in a code string is smaller. This modulation code is described in, for example, Kees A. Schouhamer Immink, "EFMPlus: THE CODING FORMAT OF THE MULTIMEDIA COMPACT DISC", IEEE Transaction on Consumer Electronics, Vol. 41, Issue 3, August 1995 and International Publication No. 95/22802.

In addition, in BDs, a modulation code called "17 Parity preserve/Prohibit (17PP)" is used and direct current (DC) control bits are periodically defined in the recording data format of a BD. A DC control bit of "0" or "1" that reduces the absolute value of a DSV in a code string is selected, and encoding is executed.

As a next-generation optical disc that follows on from the CD, DVD, and BD, which are widely used now, the present assignee has already proposed a bulk-recording (or simply bulk) optical disc described in, for example, Japanese Unexamined Patent Application Publication No. 2008-135144 and Japanese Unexamined Patent Application Publication No. 2008-176902.

Bulk recording herein refers to a technology for realizing large recording capacity by, as illustrated in FIG. 33, for example, performing multilayer recording with laser light that is radiated onto an optical recording medium (a bulk recording medium 100) having at least a cover layer 101 and a bulk layer (recording layer) 102 and whose focus position is sequentially changed.

With respect to such bulk recording, a recording technology called a "microholographic method" is disclosed in Japanese Unexamined Patent Application Publication No. 2008-135144. In the microholographic method, a so-called holographic recording material is used as a recording material of the bulk layer 102. As a holographic recording material, for example, a photo-polymerizable photopolymer or the like is widely used.

Microholographic methods are roughly classified into positive microholographic methods and negative microholographic methods.

A positive microholographic method is a method in which two light beams (a light beam A and a light beam B) that face each other are condensed at the same position to form minute interference fringes (hologram), which are used as recording marks.

A negative microholographic method is, in contrast to a positive microholographic method, a method in which interference fringes that have been formed in advance are deleted by radiating laser light and the deleted portions are used as recording marks. In a negative microholographic method, it is necessary to perform a process for forming interference fringes in the bulk layer in advance as an initialization process.

In addition, as a bulk recording method different from microholographic methods, the present assignee has also proposed a recording method in which voids are formed as recording marks, as disclosed in, for example, Japanese Unexamined Patent Application Publication No. 2008-176902.

The void recording method is a method in which voids are recorded in the bulk layer 102 that is composed of a recording material such as a photo-polymerizable photopolymer by radiating laser light at relatively high power onto the bulk layer 102. As described in Japanese Unexamined Patent Application Publication No. 2008-176902, the formed voids each have a refractive index different from the other portions of the bulk layer 102 and therefore the reflectivity of light is increased at boundaries between the voids and the other portions. Therefore, the voids serve as recording marks, thereby realizing information recording by formation of the void marks.

Since a hologram is not formed in the void recording method, recording can be performed by radiating only a single light beam. That is, it is not necessary to condense two light beams at the same position to form a recording mark as in the case of the positive microholographic method described above.

In addition, in contrast to a negative microholographic method, it is not necessary to perform an initialization process, which is preferable.

It is to be noted that although an example in which precure light is radiated before void recording is described in Japanese Unexamined Patent Application Publication No. 2008-176902, voids can be recorded without radiation of the precure light.

As described above, various recording methods have been proposed for a bulk-recording optical disc recording medium. The recording layer (bulk layer) of such a bulk optical disc recording medium does not have a multilayer structure in an explicit sense, that is, for example, there is no plurality of reflective films. In other words, in the bulk layer 102, a reflective film and a pre-groove for each recording layer, which are typically included in a common multilayer disc, are not provided.

Therefore, it is difficult to perform focus servo and tracking servo with the structure of the bulk recording medium 100 illustrated in FIG. 33 when marks have not yet been formed during recording.

For this reason, in practice, the bulk recording medium 100 is provided with a reference reflection plane (reference plane) having pre-grooves illustrated in FIG. 34.

More specifically, pre-grooves (position guiding elements) formed of, for example, pits or grooves are formed in a lower surface side of the cover layer 101 in a spiral or concentric pattern, and a selective reflection film 103 is formed on the lower surface side. On the lower side of the cover layer 101 on which the selective reflection film 103 has been formed, the bulk layer 102 is stacked through an intermediate layer 104, which is composed of an adhesive material such as a ultraviolet (UV) curable resin.

By forming the pre-grooves from pits or grooves as described above, for example, absolute position information (address information) such as radius position information and rotation angle information is recorded. In the following description, a plane (a plane on which the selective reflection film 103 is formed in this case) in which such pre-grooves are formed and on which the absolute position information is recorded is called a "reference plane Ref".

With the structure of the medium described above being adopted, not only laser light (hereinafter also referred to as recording/playback laser light or simply recording/playback light) for recording (or playing back) marks, but also servo laser light (also simply referred to as servo light) as laser light for position control are radiated onto the bulk recording medium 100 through a common objective lens as illustrated in FIG. 34.

At this time, if the servo laser light reaches the bulk layer 102, mark recording performed inside the bulk layer 102 may be adversely affected. For this reason, in the bulk recording method, laser light having a different wavelength range from the recording/playback laser light has been used as the servo laser light in the past, and the selective reflection film 103 having such wavelength selectivity that the servo laser light is reflected and the recording/playback laser light passes therethrough has been provided as a reflective film formed on the reference plane Ref.

On the basis of the above description, the operation during mark recording performed on the bulk recording medium 100 will be described. First, when multilayer recording is performed on the bulk layer 102 on which no pre-groove or reflective film is formed, the layer positions in the depth direction of the bulk layer 102 at which marks are recorded are determined in advance. In FIG. 34, an example in which a total of five information recording layer positions L, namely a first information recording layer position L1 to a fifth information recording layer position L5, are set as the layer positions (also referred to as mark formation layer positions or information recording layer positions) in the bulk layer 102 at which marks are formed is illustrated. As illustrated in FIG. 34, the first information recording layer position L1 is an information recording layer position L set at the top and the other information recording layer positions L are set on the lower layer side in order from L2 to L5.

When marks have not yet been formed during recording, focus servo and tracking servo for each layer position in the bulk layer 102 on the basis of reflected light of the recording/playback laser light are not performed. Therefore, focus servo control and tracking servo control of the objective lens during recording are performed by following the pre-grooves in the reference plane Ref with the spot position of the servo laser light on the basis of the reflected light of the servo laser light.

However, in order to perform mark recording, it is necessary for the recording/playback laser light to reach the bulk layer 102 formed on the lower layer side of the reference plane Ref and to be able to select the focus position in the bulk layer 102. Therefore, in this case, a recording/playback light focus mechanism (expander) for independently adjusting the focus position of the recording/playback laser light is provided in an optical system separately from the focus mechanism for the objective lens.

That is, by changing the collimation of the recording/playback laser light that is incident upon the objective lens with the expander that has been provided, the focus position of the recording/playback laser light is adjusted independently of that of the servo laser light.

The position of the recording/playback laser light in the tracking direction is automatically controlled by the above-described tracking servo of the objective lens using the servo laser light such that the position is directly below the pre-grooves in the reference plane Ref.

When the bulk recording medium 100 on which mark recording has already been performed is played back, it is not necessary to control the position of the objective lens on the basis of the reflected light of the servo laser light as in the case of recording. That is, during playback, the focus servo control and the tracking servo control of the objective lens are performed on mark strings formed at one of the information recording layer positions L (also referred to as information recording layers L or mark formation layers L in terms of playback) to be played back on the basis of the reflected light of the recording/playback laser light.

SUMMARY OF THE INVENTION

When a method for recording voids is adopted for the bulk recording medium 100 described above, in particular, not mark edge recording in which recording information is represented by the combination between the lengths of marks and those of spaces, but mark position recording is adopted because it is difficult to, for example, accurately control the edge positions of recording marks.

When the mark position recording is adopted, in order to secure steady playback performance it is more important to make the intervals at which voids are formed sparse than to perform the DSV control as in the case the mark edge recording.

FIGS. 35A and 35B are diagrams illustrating this point. FIG. 35A illustrates the reflected light when the intervals at which voids are formed in the bulk layer 102 are dense, and FIG. 35B illustrates the reflected light when the intervals at which voids are formed in the bulk layer 102 are sparse.

Considering reading of recording codes recorded on multiple layers in the bulk recording medium 100, it is important to suppress interlayer cross-talk, which is a leakage of recording codes from a different layer, in order to improve the playback capabilities. By comparing FIGS. 35A and 35B, it is clear that, in order to suppress the interlayer cross-talk, the number of voids to be formed (the number of symbols "1" in recording codes) is preferably smaller and more sparse.

In the EFM, EFM plus, and 17PP, which are modulation codes used for optical discs of the related art, it is possible to perform the DSV control during mark edge recording, but a recording code string in which symbols "1" are sparse may not be generated.

Therefore, it is desirable to propose an encoding method suitable for the bulk recording method (multilayer recording) in which the mark position recording is performed.

Therefore, in an embodiment of the present invention, an encoding apparatus is configured as described below.

That is, an encoding apparatus according to an embodiment of the present invention is an encoding apparatus that converts m-bit data words into n-bit code words, where m and n are both integers and satisfy an expression $2^n \geq 2^m \times 2$. The encoding apparatus includes a first conversion table in which $2^m$-bit data words are associated with $2^m$ n-bit code words selected from $2^n$ n-bit code words, and a second conversion table in which the $2^m$ m-bit data words are associated with $2^m$ n-bit code words that have been selected from the $2^n$ n-bit code words and that do not overlap with the $2^m$ n-bit code words in the first conversion table.

The encoding apparatus also includes an encoder configured to select and output an n-bit code word with which an m-bit data word that has been input is associated in the first conversion table or an n-bit code word with which the m-bit data word that has been input is associated in the second conversion table, the selected and output n-bit code word having a smaller number of symbols "1".

In addition, in an embodiment the present invention, a recording apparatus is configured as described below.

That is, a recording apparatus according to an embodiment of the present invention is a recording apparatus that converts m-bit data words into n-bit code words, where m and n are both integers and satisfy an expression $2^n \geq 2^m \times 2$, and performs recording on an optical recording medium. The recording apparatus includes a first conversion table in which $2^m$ m-bit data words are associated with $2^m$ n-bit code words selected from $2^n$ n-bit code words, and a second conversion table in which the $2^m$ m-bit data words are associated with $2^m$ n-bit code words that have been selected from the $2^n$ n-bit code words and that do not overlap with the $2^m$ n-bit code words in the first conversion table.

The recording apparatus also includes an encoder configured to select and output an n-bit code word with which an m-bit data word that has been input is associated in the first conversion table or an n-bit code word with which the m-bit data word that has been input is associated in the second conversion table, the selected and output n-bit code word having a smaller number of symbols "1".

The recording apparatus also includes a recorder configured to perform recording on the optical recording medium on the basis of the n-bit code word output from the encoder.

In addition, in an embodiment of the present invention, a decoding apparatus is configured as described below.

That is, a decoding apparatus according to an embodiment of the present invention is a decoding apparatus that decodes a code string obtained by executing encoding for converting m-bit data words into n-bit code words, where m and n are both integers and satisfy an expression $2^n \geq 2^m \times 2$ and where n-bit code words obtained from a first conversion table in which $2^m$ m-bit data words are associated with $2^m$ n-bit code words selected from $2^n$ n-bit code words or n-bit code words obtained from a second conversion table in which the $2^m$ m-bit data words are associated with $2^m$ n-bit code words that have been selected from the $2^n$ n-bit code words and that do not overlap with the $2^m$ n-bit code words in the first conversion table are sequentially output. The decoding apparatus includes a first decoding table that is the first conversion table or that is a table in which the $2^m$ m-bit data words are associated with the $2^m$ n-bit code words in the same manner as the first conversion table, a second decoding table that is the second conversion table or a table in which the $2^m$ m-bit data words are associated with the $2^m$ n-bit code words in the same manner as the second conversion table, and a decoder configured to search both the first decoding table and the second decoding table for an m-bit data word associated with an n-bit code word that has been input, in order to output the m-bit data word.

As described above, in an embodiment of the encoding in the present invention, a first conversion table in which $2^m$ m-bit data words are associated with $2^m$ n-bit code words selected from $2^n$ n-bit code words and a second conversion table in which the $2^m$ m-bit data words are associated with $2^m$ n-bit code words that have been selected from the $2^n$ n-bit code words and that do not overlap with the $2^m$ n-bit code words in the first conversion table are prepared, and an n-bit code word in the first conversion table or an n-bit code word in the second conversion table with which an m-bit data word that has been input is associated is selected and output, the selected and output n-bit code word has a smaller number of symbols "1".

According to an embodiment of the present invention, encoding can be performed in such a way that the number of symbols "1" is likely to be sparse.

In addition, with respect to a code string obtained by the encoding in the present invention, both the first decoding table and the second decoding table are searched for an m-bit data word associated with an n-bit code word that has been input and the m-bit data word is output, thereby properly executing decoding.

According to an embodiment of the present invention, encoding can be performed in such a way that the number of symbols "1" is small and sparse. Therefore, in a case in which a bulk recording method for performing multilayer recording inside a bulk layer through mark position recording is adopted, preferable encoding can be performed. As a result, steadier playback of a bulk recording medium can be realized.

In addition, in an embodiment of the present invention, since the code words stored in the first conversion table and the code words stored in the second conversion table do not overlap with each other, so-called "propagation of errors", where an error in the previous decoding operation causes an error in the result of the next decoding operation, can be suppressed.

In addition, in the decoding apparatus (and the decoding method) according to the embodiment of the present invention, a code string obtained by the encoding in the present invention can be properly decoded and, as a result, decoding without propagation of errors can be realized.

BRIEF DESCRIPTION OF THE DRAWINGS

FIG. 3 is a diagram illustrating an example (leading portion) of the data structure of an S1 encoding table according to a first embodiment;

FIG. 4 is a diagram illustrating an example (continuation) of the data structure of the S1 encoding table according to the first embodiment;

FIG. 5 is a diagram illustrating an example (continuation) of the data structure of the S1 encoding table according to the first embodiment;

FIG. 6 is a diagram illustrating an example (leading portion) of the data structure of an S2 encoding table according to the first embodiment;

FIG. 7 is a diagram illustrating an example (continuation) of the data structure of the S2 encoding table according to the first embodiment;

FIG. 8 is a diagram illustrating an example (continuation) of the data structure of the S2 encoding table according to the first embodiment;

FIG. 11 is a diagram illustrating a specific example of code words and occurrences of the code words obtained by performing encoding in the comparative example;

FIG. 13 is a diagram illustrating a specific example of code words and occurrences of the code words obtained by performing encoding according to an embodiment;

FIG. 17 is a diagram illustrating an example (leading portion) of the data structure of an S1 encoding table according to a second embodiment;

FIG. 18 is a diagram illustrating an example (continuation) of the data structure of the S1 encoding table according to the second embodiment;

FIG. 19 is a diagram illustrating an example (continuation) of the data structure of the S1 encoding table according to the second embodiment;

FIG. 20 is a diagram illustrating an example (leading portion) of the data structure of an S2 encoding table according to the second embodiment;

FIG. 21 is a diagram illustrating an example (continuation) of the data structure of the S2 encoding table according to the second embodiment;

FIG. 26 is a diagram illustrating an example of the data structure of an S1 encoding table according to a third embodiment;

FIG. 27 is a diagram illustrating an example (continuation) of the data structure of the S1 encoding table according to the third embodiment;

FIG. 28 is a diagram illustrating an example of the data structure of an S2 encoding table according to the third embodiment;

FIG. 34 is a diagram for illustrating the cross-sectional structure of an actual bulk recording medium having a reference plane and servo control during recording and playback.

DESCRIPTION OF THE PREFERRED EMBODIMENTS

Best modes (hereinafter referred to as embodiments) for implementing the present invention will be described hereinafter.

Figure 1:
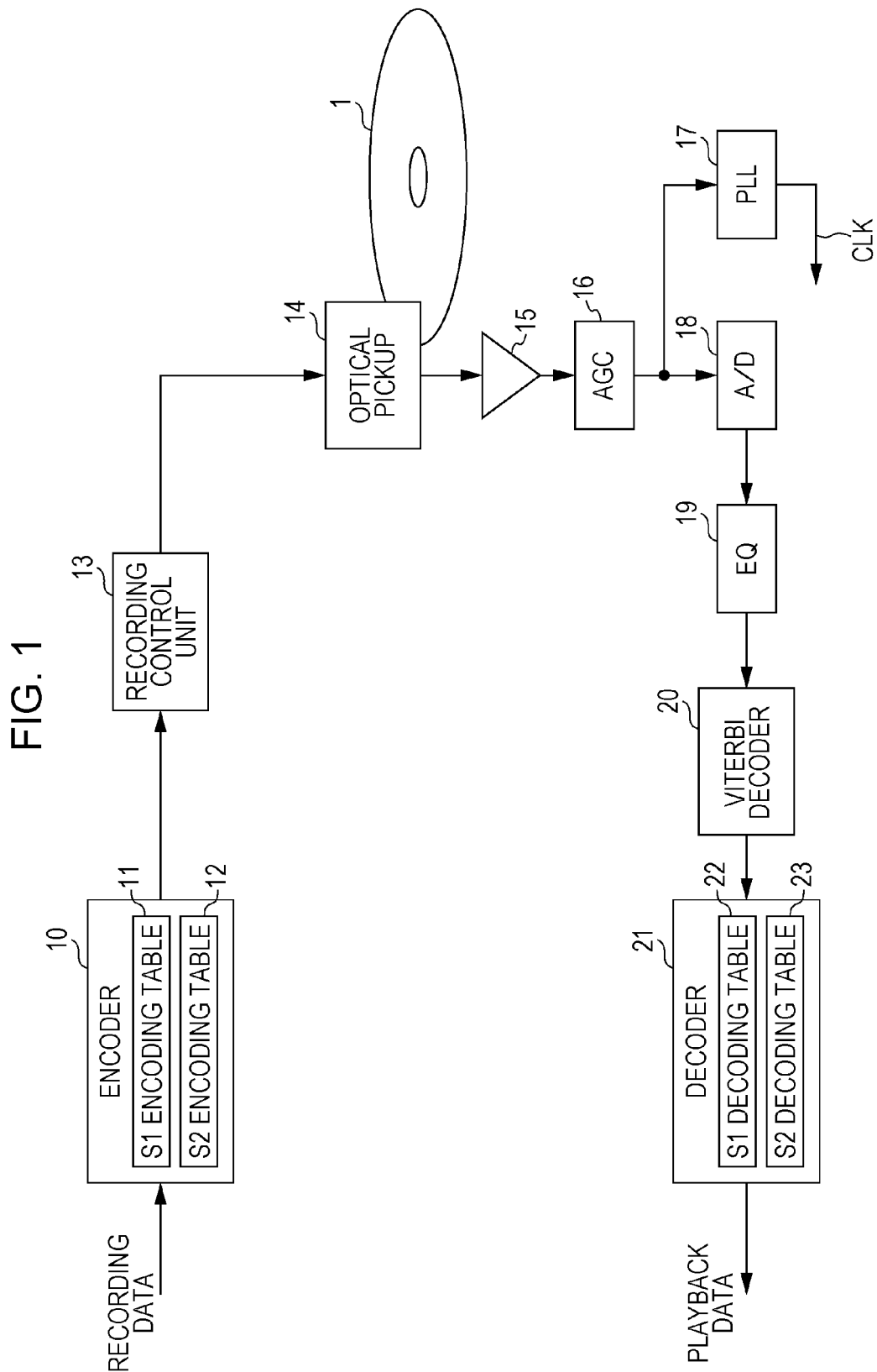
FIG. 1 is a diagram illustrating the internal configuration of a recording/playback apparatus according to an embodiment.

Embodiments will be described in the following order.
1. First Embodiment
1-1. Configuration of Recording/Playback Apparatus and Optical Recording Medium
1-2. Example of Encoding Table
1-3. Comparative Example
1-4. Encoding with Sparse Control According To Embodiment
1-5. Decoding Process
1-6. Effects Produced by Encoding According To First Embodiment
2. Second Embodiment
2-1. Example of Encoding Table
2-2. Effects Produced by Encoding According To Second Embodiment
3. Third Embodiment
3-1. Example of Encoding Table
3-2. Effects Produced by Encoding According To Third Embodiment
4. Modifications 1. First Embodiment 1-1. Configuration of Recording/Playback Apparatus and Optical Recording Medium FIG. 1 is a diagram illustrating the internal configuration of a recording/playback apparatus according to an embodiment of the present invention.

First, a bulk recording medium 1 is, as is the case with one illustrated in FIG. 34, a bulk optical recording medium having a recording layer as a bulk layer.

The bulk recording medium 1 is a disc-type optical recording medium, and mark recording (information recording) is performed by radiating laser light onto the bulk recording medium 1 that is being driven in a rotating manner. Playback of recorded information is also performed by radiating laser light onto the bulk recording medium 1 that is being driven in a rotating manner.

It is to be noted that the "optical recording medium" is a general term of recording media with which recording and playback of information is performed using radiation of light.

Figure 2:
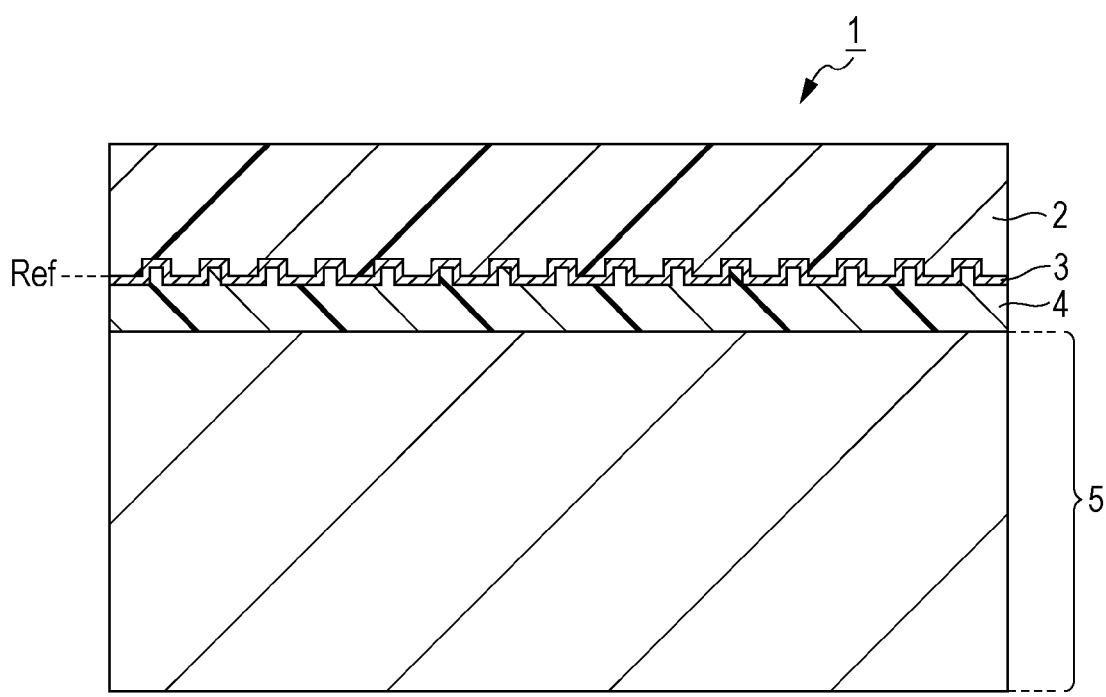
FIG. 2 is a cross-sectional view of the structure of an optical recording medium, which is a target of recording and playback in an embodiment.

FIG. 2 is a cross-sectional view of the structure of the bulk recording medium 1.

As illustrated in FIG. 2, a cover layer 2, a selective reflection film 3, an intermediate layer 4, a bulk layer 5 are formed in the bulk recording medium 1 in this order from the upper layer side to the lower layer side.

It is to be noted that the "upper layer side" herein refers to an upper layer side at the time when a surface upon which laser light radiated from an apparatus that radiates the laser light for recording and playback is incident is regarded as an upper surface.

It is also to be noted that a "depth direction", which is a term used herein, refers to a direction corresponding to the vertical direction according to the definition of the above-described "upper layer side" (that is, a direction parallel to a direction in which the laser light radiated from the apparatus is incident; or a focus direction).

In the bulk recording medium 1, the cover layer 2 is composed of a resin such as polycarbonate or acrylic resin. As illustrated in FIG. 2, pre-grooves are formed in a lower surface of the cover layer 2 as position guiding elements for indicating the position at which recording or playback is performed and have an irregular sectional shape. The position guiding elements are formed in a spiral or concentric pattern.

The pre-grooves are formed as a continuous groove or as pit arrays. If the pre-grooves are formed as pit arrays, for example, position information (absolute position information such as rotation angle information for indicating the rotation angle position on a disc and radius position information) is recorded on the basis of the combination between the lengths of pits and those of lands. On the other hand, if the pre-grooves are formed as a continuous groove, the continuous groove is periodically wobbled when being formed, thereby making it possible to record the position information on the basis of the periodic information of the wobble.

The cover layer 2 is produced by, for example, injection molding using a stamper in which such pre-grooves (irregular shape) are formed.

In addition, the selective reflection film 3 is formed on the lower surface side of the cover layer 2 in which the pre-grooves have been formed.

As described above, in a bulk recording method, not only light (recording/playback laser light) with which mark recording and playback is performed on the bulk layer 5 as a recording layer, but also light (servo laser light) for obtaining error signals of tracking and focusing on the basis of the above-described pre-grooves are radiated.

At this time, if the servo laser light reaches the bulk layer 5, mark recording performed inside the bulk layer 5 may be adversely affected. For this reason, a reflective film having such selectivity that the servo laser light is reflected but the recording/playback laser light passes therethrough is necessary.

In a bulk recording method, laser light beams having different wavelengths from each other have been used for the recording/playback laser light and the servo laser light. Therefore, as the selective reflection film 3, a selective reflection film having such selectivity that light having the same wavelength as the servo laser light is reflected and light having a different wavelength passes therethrough is used.

In this embodiment, the wavelength of the recording/playback laser light is assumed to be about 405 nm, and that of the servo laser light is assumed to be about 640 nm.

The bulk layer 5 as a recording layer is stacked (adhered) on the lower layer side of the selective reflection film 3 through the intermediate layer 4, which is composed of, for example, an adhesive material such as a UV curable resin.

As a forming material (recording material) of the bulk layer 5, an appropriate material may be used in accordance with the bulk recording method to be used, such as a positive microholographic method, a negative microholographic method, or a void recording method, which have been described above.

It is to be noted that a mark recording method adopted for an optical recording medium according to an embodiment of the present invention is not particularly limited, and any method in the category of the bulk recording method may be adopted. A case in which the void recording method is adopted will be described hereinafter as an example.

In the bulk recording medium 1 having the above-described configuration, the selective reflection film 3 in which the pre-grooves as the position guiding elements have been formed serves as a reference reflection plane when position control of the recording/playback laser light is performed on the basis of the servo laser light as described above. For this reason, a plane on which the selective reflection film 3 is formed is referred to as a "reference plane Ref" in an embodiment.

As illustrated in FIG. 34, in a bulk optical recording medium, the position of each layer (an information recording layer position L) at which information is to be recorded is preset in order to perform multilayer recording inside a bulk layer. In the bulk recording medium 1 according to this embodiment, too, a necessary number of information recording layer positions L are preset, although illustration thereof is omitted.

With respect to a specific example of each layer, an information recording layer position L located at the top is set at a position about 100 μm lower than the surface (top surface) of the bulk recording medium 1. In addition, an information recording layer position L located at the bottom is set at a position about 300 μm lower than the surface of the bulk recording medium 1.

Each information recording layer position L located between the information recording layer position L located at the top and the information recording layer position L located at the bottom is set in such a way that the distance to an adjacent information recording layer position L is 10 μm on an average in consideration of interlayer cross-talk.

In addition, the position of the reference plane Ref is about 50 μm lower than the surface of the bulk recording medium 1. Therefore, the distance from the reference plane Ref to the information recording layer position L located at the top is about 50 μm.

Now, FIG. 1 is referred to again.

In the recording/playback apparatus according to this embodiment, an optical pickup 14 that radiates laser light onto the bulk recording medium 1 for recording and playback is provided.

In the optical pickup 14, a recording/playback laser light source and a servo laser light source that radiate recording/ playback laser light and servo laser light, respectively, are provided as has been described with reference to FIG. 34. In addition, an objective lens that collectively condenses and radiates the recording/playback laser light and the servo laser light onto the bulk recording medium 1 is provided and a dual-axis actuator that holds the objective lens such that the objective lens can be moved in the tracking direction and the focusing direction is also provided. Furthermore, a splitting element (for example, a dichroic prism) that combines the recording/playback laser light and the servo laser light radiated from the respective light sources along the same axis and that guides the recording/playback laser light and the servo laser light to the objective lens, as well as splitting the reflected light of the recording/playback laser light and that of the servo laser light, which are incident thereupon from the bulk recording medium 1 through the objective lens, into different optical paths, a recording/playback optical receiver that receives the reflected light of the recording/playback laser light, and a servo optical receiver that receives the reflected light of the servo laser light are also included.

In addition, a recording/playback focus mechanism (an expander) that changes the collimation of the recording/playback laser light that is incident upon the objective lens and that has been described with reference to FIG. 34 is also provided. By providing the recording/playback focus mechanism, it is possible to selectively record marks at any information recording layer position L set in the bulk layer 5 while focus servo of the objective lens is being performed for the servo laser light in relation to the reference plane Ref during recording.

It is to be noted that, in the recording/playback apparatus in practice, although a position onto which the laser light is radiated is controlled on the basis of the reflected light of the servo laser light during recording as has been described with reference to FIG. 34, and although a servo circuit for controlling a position onto which the laser light is radiated on the basis on the reflected light of the recording/playback laser light during playback, a slide mechanism for the optical pickup 14, and a spindle motor that drives the bulk recording medium 1 in a rotating manner are provided, such a configuration is not directly related to an encoding process and a decoding process according to an embodiment, and therefore description thereof with reference to the drawings is omitted herein.

In the recording/playback apparatus, an encoder 10, an S1 encoding table 11, and an S2 encoding table 12 are provided as the configuration for generating a code string (recording code string) to be recorded in the bulk layer 5 as illustrated in FIG. 1.

The encoder 10 encodes input recording data by sequentially converting m-bit data words into n-bit code words using the S1 encoding table 11 and the S2 encoding table 12.

The encoding process according to an embodiment that is executed by the encoder 10 using the S1 encoding table 11 and the S2 encoding table 12 will be described later.

The S1 encoding table 11 and the S2 encoding table 12 are stored in the encoder 10 or in an external memory device.

A recording code string obtained by the encoding process executed by the encoder 10 is supplied to a recording control unit 13.

The recording control unit 13 drives the above-described recording/playback laser light source in the optical pickup 14 on the basis of the recording code string to cause the recording/playback laser light source to emit laser light, thereby executing mark recording inside of the bulk layer 5.

In this case, the recording control unit 13 does not execute a non-return-to-zero (NRZ) modulation process, which is typically executed in an optical disc system such as a DVD or a BD, on the recording code string. The recording control unit 13 drives the recording/playback laser light source to cause the recording/playback laser light source to emit laser light, so that so-called mark position recording is performed.

In this embodiment, the recording control unit 13 drives the recording/playback laser light source to cause the recording/playback laser light source to emit laser light in such a way that a mark is recorded when there is a symbol "1" in the recording code string and a space is formed when there is a symbol "0" in the recording code string.

In addition, light reflected from a mark that has been recorded onto the bulk recording medium 1 is detected by the recording/playback optical receiver in the optical pickup 14, and a playback signal is obtained.

The playback signal that has been obtained in such a way and that is related to a mark string is amplified by an amplifier 15 and then subjected to a gain adjustment in an automatic gain control (AGC) circuit 16.

The playback signal that has propagated through the AGC circuit 16 is then supplied to a phase-locked loop (PLL) circuit 17 and an analog-to-digital (A/D) converter 18.

The PLL circuit 17 generates clock signals CLK by executing a PLL process on the basis of the playback signal. The clock signals CLK are supplied to each component such as the A/D converter 18 for which the clock signals CLK are necessary.

The A/D converter 18 executes digital sampling on the playback signal. The playback signal sampled by the A/D converter 18 is then supplied to an equalizer (EQ) 19.

The equalizer 19 and a Viterbi decoder 20 are provided in order to binarize the playback signal using a so-called partial response maximum likelihood (PRML) decoding method.

The equalizer 19 executes a partial response (PR) equalization process on the playback signal that has been sampled by the A/D converter 18 in accordance with a certain class of PR (for example, 1:2:2:1 or 1:2:2:2:1). The playback signal is then output to the Viterbi decoder 20.

The Viterbi decoder 20 executes a Viterbi decoding process on the playback signal that has been subjected to the PR equalization in order to obtain a binary playback signal.

The binary playback signal (corresponds to the recording code string described above) obtained by the Viterbi decoder 20 is supplied to a decoder 21.

The decoder 21 obtains a playback data string from the code string as the binary playback signal by sequentially converting n-bit code words into m-bit data words using an S1 decoding table 22 and an S2 decoding table 23. That is, a decoding process for obtaining playback data for playing back the recording data is executed.

A specific decoding process executed by the decoder 21 using the S1 decoding table 22 and the S2 decoding table 23 will also be described later.

The S1 decoding table 22 and the S2 decoding table 23 are stored in the decoder 21 or in an external memory device.

It is to be noted that the configuration of the recording/playback apparatus illustrated in FIG. 1 is not limited to that described above.

For example, although a case in which a process for binarizing a playback signal is realized by executing the PRML decoding process has been described above, a method for binarizing the playback signal is not limited to this.

In addition, a configuration is also possible in which the PLL process for generating the clock signals CLK is realized by, for example, executing a digital PLL process such as an interpolated timing recovery (ITR) method.

1-2. Example of Encoding Table

The S1 encoding table 11 and the S2 encoding table 12 that are used for encoding according to the first embodiment will be described hereinafter.

In the coding for converting an m-bit data word (m is an integer of 1 or more) into an n-bit code word (n is an integer of 1 or more) according to the first embodiment, m is assumed to be 8 and n is assumed to be 16.

In addition, in this embodiment, the encoding is executed such that a code string obtained as a result of the encoding satisfies run-length limitations of the smallest number d of consecutive symbols "0" (d≠0) and the largest number k of consecutive symbols "0" (k>d). More specifically, in this embodiment, run-length limitations of d=2 and k=10 are to be satisfied. In other words, there is a limitation where the number of consecutive symbols "0" is two or more and ten or less.

Under these conditions, in this embodiment, code words to be stored in the S1 encoding table 11 and 16-bit code words to be stored in the S2 encoding table 12 are selected in the following manner.

First, there are 302 16-bit binary code words that begin with a symbol "1" or "01", that satisfy the run-length limitations of d=2 and k=10 between symbols "1" which appear halfway, and that end with a symbol "1" or nine or less consecutive symbols "0".

From this code word set, 256 code words that each have a small number of symbols "1" (that is, the number of symbols "1" in n bits; hereinafter also referred to as an "occurrence") are selected. The obtained code word set will be referred to as an "S1 code word set".

Furthermore, in the S1 code word set, a set of code words that end with two or more and nine or less symbols "0" are categorized into "S11" and a set of code words that end with symbol "1" or "10" are categorized into "S12".

On the other hand, there are 256 16-bit binary code words that begin with two or more and nine or less consecutive symbols "0", that satisfy the run-length limitations of d=2 and k=10 between symbols "1" which appear halfway, and that end with a symbol "1" or nine or less consecutive symbols "0". This code word set will be referred to as an "S2 code word set".

In the S2 code word set, a set of code words that end with two or more and nine or less consecutive symbols "0" are categorized into "S21" and a set of code words that end with symbol "1" or "10" are categorized into "S22".

Here, the S1 encoding table 11 stores, as can be understood from the name thereof, the S1 code word set (256 code words) as code words to be associated with 256 data words.

Similarly, the S2 encoding table 12 stores the S2 code word set (256 code words) as code words to be associated with the 256 data words.

In this embodiment, the 256 code words in the S1 encoding table 11 are arranged in order of descending occurrence and associated with the 256 8-bit data words.

On the other hand, the 256 code words in the S2 encoding table 12, in contrast, are associated with the same 256 8-bit data words in order of ascending occurrence.

FIGS. 3 to 5 illustrate the data structure of the S1 encoding table 11, and FIGS. 6 to 8 illustrate the data structure of the S2 encoding table 12.

In FIGS. 3 to 8, the "Data" column indicates data words (in hexadecimal notation), and the "Code" column indicates code words. The "Occ" column indicates occurrences.

As can be seen by referring to FIGS. 3 to 8, by executing an assignment of the code words in the above-described manner, a data word with which a code word having a higher occurrence is associated in the S1 encoding table 11 is associated with a code word having a lower occurrence in the S2 encoding table 12. In contrast, a data word with which a code word having a lower occurrence is associated in the S1 encoding table 11 is associated with a code word having a higher occurrence in the S2 encoding table 12.

Figure 9:
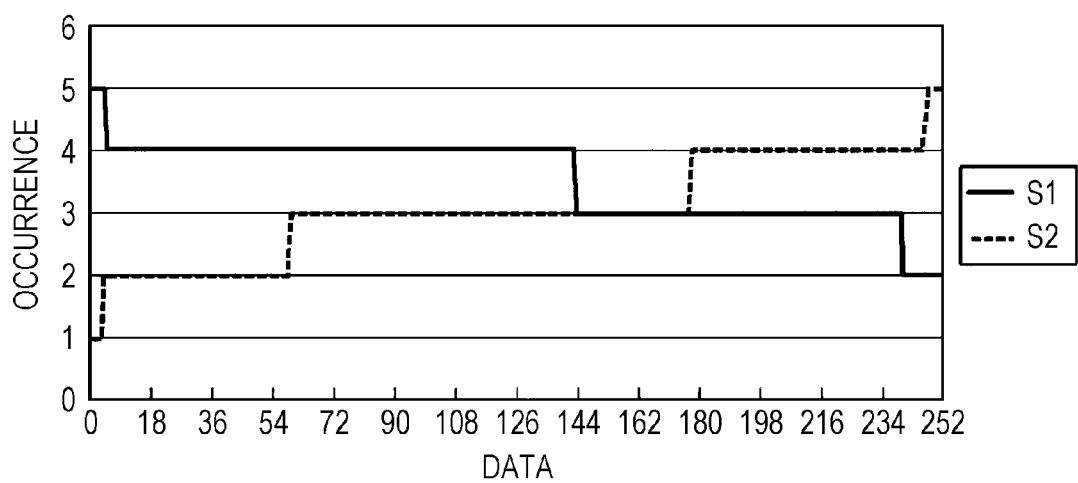
FIG. 9 is a diagram illustrating a comparison between the occurrences of code words assigned to the same data words in the S1 encoding table and the S2 encoding table.

In order to make sure of the above-described procedure, a comparison between the occurrences of the code words assigned to the same data words using the S1 encoding table 11 and the S2 encoding table 12, respectively, are illustrated in FIG. 9.

As can be seen from FIG. 9, in this embodiment, a data word with which a code word having a higher occurrence is associated in the S1 encoding table 11 is associated with a code word having a lower occurrence in the S2 encoding table 12. In contrast, a data word with which a code word having a lower occurrence is associated in the S1 encoding table 11 is associated with a code word having a higher occurrence in the S2 encoding table 12.

In addition, a "State" value corresponding to each code word is also illustrated in FIGS. 3 to 8.

Here, the code words that belong to the S1 code word set and that are categorized into "S11" invariably satisfy the run-length limitations of d=2 and k=10 when any code word in the S1 code word set is connected to the ends thereof.

In addition, the code words that belong to the S1 code word set and that are categorized into "S12" invariably satisfy the run-length limitations of d=2 and k=10 when any code word in the S2 code word set is connected to the ends thereof.

In the case of the code words belonging to the S2 code word set, too, those categorized into "S21" invariably satisfy the run-length limitations when any code word in the S1 code word set is connected to the ends thereof, and those categorized into "S22" invariably satisfy the run-length limitations when any code word in the S2 code word set is connected to the ends thereof.

Thus, the last digits of "S11", "S12", "S21", and "S22", namely 1 and 2, indicate which type of code word, that is, a code word in the S1 code word set or a code word in the S2 code word set, is to be connected to the end of a code word categorized into the corresponding category in order to satisfy the run-length limitations.

Each "State" value indicates which of the S1 code word set and the S2 code word set a code word to be connected to the end of the corresponding code word belongs to. That is, if the "State" value is "1", a code word in the S1 code word set is to be connected to the end of the corresponding code word, and if the "State" value is "2", a code word in the S2 code word set is to be connected to the end of the corresponding code word.

It is to be noted that although a case in which the values of occurrences and the "State" values are stored along with the data words and the code words is illustrated in FIGS. 3 to 8, the values of occurrences can be calculated by counting symbols one by one and therefore it is not necessary to store the values of occurrences in a table in advance. The "State" values, too, can be obtained by checking the arrangement of symbols "0" and "1" one by one in the code words and therefore it is not necessary to store the "State" values in a table in advance.

1-3. COMPARATIVE EXAMPLE

Before description of the coding process according to this embodiment, encoding for satisfying the run-length limitations of d=2 and k=10 using the S1 encoding table 11 and the S2 encoding table 12 will be described hereinafter as a comparative example.

Figure 10:
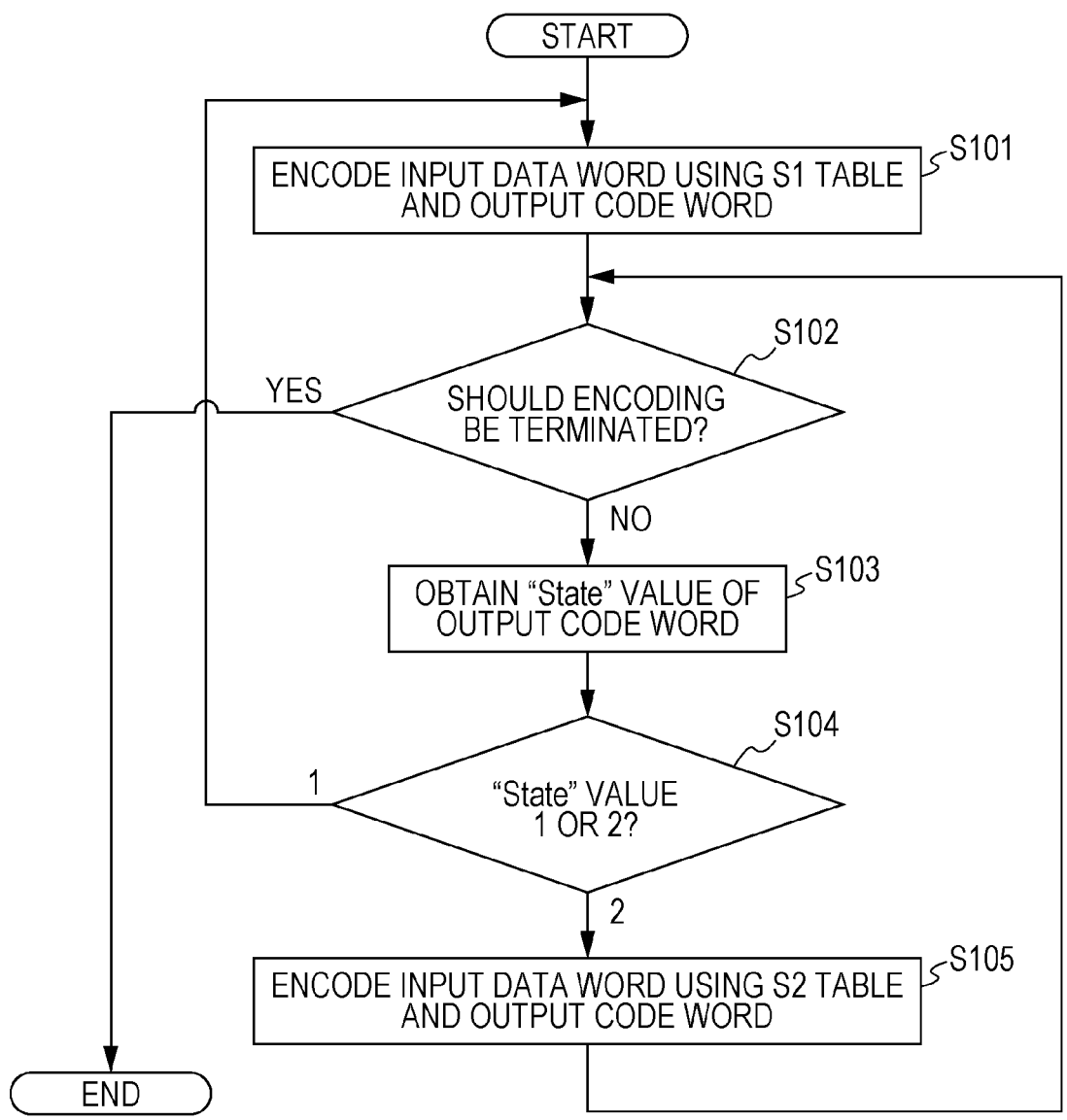
FIG. 10 is a flowchart illustrating an encoding process in a comparative example (without sparse control)

FIG. 10 is a flowchart illustrating the coding process as a comparative example.

First, in the comparative example, an input data word is encoded using the S1 encoding table 11 and the obtained code word is output in step S101.

That is, in this case, a first input data word is encoded using the S1 encoding table 11.

Needless to say, the first input data word may be encoded using the S2 encoding table 12.

In step S102, whether or not the encoding should be terminated (for example, all data to be recorded have been encoded) is judged. If a negative result has been obtained, that is, if the encoding should not still be terminated, the processing proceeds to step S103.

If a positive result has been obtained, that is, if the encoding should be terminated, a series of processes illustrated in FIG. 10 end as illustrated in FIG. 10.

In step S103, the "State" value of the output code word is obtained. In step S104, whether the "State" value is 1 or 2 is judged.

If it has been judged in step S104 that the "State" value is 1, the processing returns to step S101. The input data word is encoded using the S1 encoding table 11 and the obtained code word is output.

On the other hand, if it has been judged that the "State" value is 2, the processing proceeds to step S105. In step S105, the input data word is encoded using the S2 encoding table 12 and the obtained code word is output. After the code word is output in step S105, the processing returns to step S102 as illustrated in FIG. 10.

When only satisfaction of the run-length limitations is considered, the next input data word is encoded using the S1 encoding table 11 or the S2 encoding table 12 simply in accordance with the "State" value of the output code word.

FIG. 11 is a diagram illustrating a specific example of the code words and the occurrences of the code words obtained by executing the encoding in the comparative example.

In FIG. 11, whether each code word belongs to the S1 code word set or the S2 code word set (represented by "S1" or "S2") and the "State" value of each code word are also illustrated.

With respect to an input data word at a time t, a case in which input data words have been "0x05" at the time of t=0, "0xfa" at the time of t=1, "0xf8" at the time of t=2, "0xdf" at the time of t=3, "0x71" at the time of t=4, and "0xeb" at the time of t=5 is illustrated in the example of FIG. 11.

First, for example, at the time of t=0, encoding of the input data word "0x05" using the S1 encoding table 11 is executed (refer to step S101 described above) and a code word "0100000001001001" is output. Since the "State" value of the code word at the time of t=0 is 2, the data word "0xfa" at the time of t=1 is encoded using the S2 encoding table 12, and a code word "0010010010010010" is output.

Thus, the encoding using the S1 encoding table 11 and the S2 encoding table 12 is sequentially executed in accordance with the "State" values. As a result, the occurrences of the code words in an input data string at the time of t=0 to t=5, namely 4, 5, 4, 4, 3, and 3 in chronological order, are obtained.

1-4. Encoding with Sparse Control According To Embodiment

Encoding executed with sparse control according to an embodiment will be described hereinafter on the basis of the encoding in the comparative example described above.

Figure 12:
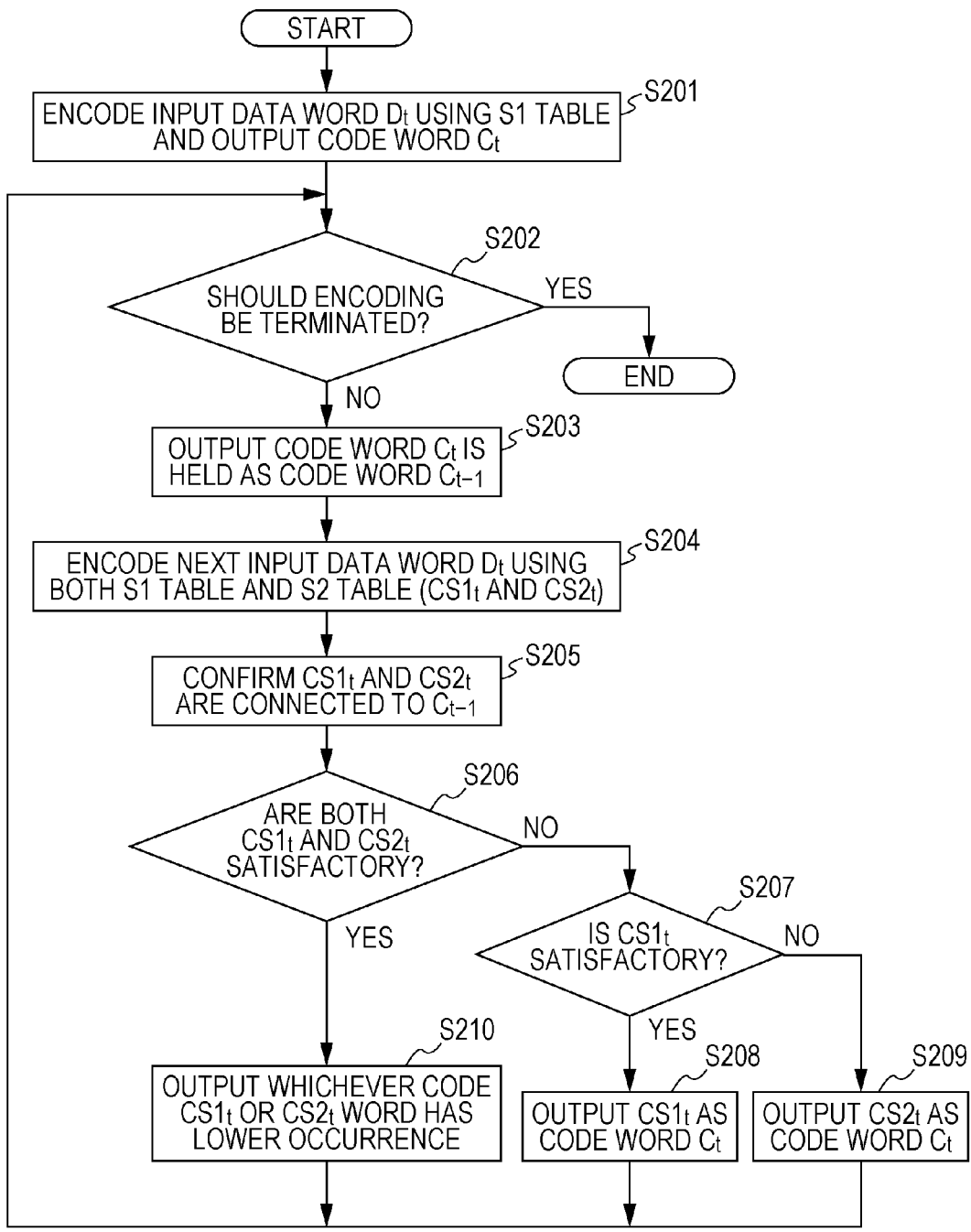
FIG. 12 is a flowchart illustrating an encoding process (with the sparse control) according to an embodiment.

FIG. 12 is a flowchart illustrating an encoding process with the sparse control according to an embodiment.

As can be seen from the above description, the encoding process according to an embodiment whose procedure is illustrated in FIG. 12 is executed by the encoder 10 illustrated in FIG. 1.

First, in step S201, an input data word $D_t$ is encoded using the S1 encoding table 11 and an obtained code word $C_t$ is output.

As can be seen from the above description, t denotes the time herein.

In this case, too, a first input data word may be encoded using the S2 encoding table 12, instead of the S1 encoding table 11.

In step S202, as in the case of step S102 described above, whether or not the encoding should be terminated is judged.

If a negative result has been obtained in step S202, that is, if the encoding should not still be terminated, the processing proceeds to step S203, and the output code word $C_t$ is held as a code word $C_{t-1}$.

If a positive result has been obtained in step S202, that is, if the encoding should be terminated, a series of processes illustrated in FIG. 12 end.

After the code word $C_t$ is held as a code word $C_{t-1}$ in step S203, a next input data word $D_t$ is encoded using both the S1 encoding table 11 and the S2 encoding table 12 in step S204.

Here, a code word obtained by encoding the input data word $D_t$ using the S1 encoding table 11 is called a "code word $CS1_t$". Similarly, a code word obtained by encoding the input data word $D_t$ using the S2 encoding table 12 is called a "code word $CS2_t$".

In step S205, a process for confirming that the code words $CS1_t$ and $CS2_t$ are connected to the code word $C_{t-1}$. More specifically, after the code words $CS1_t$ and $CS2_t$ are connected to the code word $C_{t-1}$, for example, the values at the connections are scanned.

Alternatively, the entirety of a code string obtained by connecting the code word $CS1_t$ to the code word $C_{t-1}$ and the entirety of a code string obtained by connecting the code word $CS2_t$ to the code word $C_{t-1}$ may be scanned.

In step S206, whether or not both the code words $CS1_t$ and $CS2_t$ are satisfactory is judged. That is, whether or not both the code string obtained by connecting the code word $CS1_t$ to the code word $C_{t-1}$ and the code word obtained by connecting the code word $CS2_t$ to the code word $C_{t-1}$ satisfy the run-length limitations (d=2 and k=10) is judged.

If a negative result has been obtained in step S206, that is, if not both the code words $CS1_t$ and $CS2_t$ are satisfactory because either the code word $CS1_t$ or $CS2_t$ does not satisfy the run-length limitations, the processing proceeds to step S207. In step S207, whether or not the code word $CS1_t$ is satisfactory, that is, whether or not the code string obtained by connecting the code word $CS1_t$ to the code word $C_{t-1}$ satisfies the run-length limitations, is judged.

If a positive result has been obtained in step S207, that is, if the code word $CS1_t$ is satisfactory, the code word $CS1_t$ is output as the code word $C_t$ in step S208. After that, the processing returns to step S202.

On the other hand, if a negative result has been obtained in step S207, that is, if the code word $CS1_t$ is not satisfactory (which means that the code word $CS2_t$ is satisfactory), the code word $CS2_t$ is output as the code word $C_t$ in step S209. After that, the processing returns to step S202.

If a positive result has been obtained in step S206, that is, if both the code words $CS1_t$ and $CS2_t$ are satisfactory, the processing proceeds to step S210. In step S210, whichever code word $CS1_t$ or $CS2_t$ has a lower occurrence is output as the code word $C_t$.

After that, the processing returns to step S202.

Thus, when it is necessary to satisfy the run-length limitations in the encoding process according to this embodiment, an encoding table to be used in the next encoding operation is selected not by simply referring to the "State" values, but by actually connecting the code words $CS1_t$ and $CS2_t$ that have been encoded using the S1 encoding table 11 and the S2 encoding table 12, respectively, to the code word $C_{t-1}$, which is the previous code word, and by judging whether or not both the code words $CS1_t$ and $CS2_t$ satisfy the run-length limitations. If it has been judged that both the code words $CS1_t$ and $CS2_t$ satisfy the run-length limitations, whichever code word $CS1_t$ or $CS2_t$ has a lower occurrence is selectively output.

In the encoding process with the sparse control according to this embodiment, the number of symbols "1" can be reduced in a recording code string. That is, a recording code string in which symbols "1" are sparse can be obtained.

FIG. 13 illustrates a specific example of code words and the occurrences of the code words obtained by executing the encoding according to this embodiment that has been described above.

It is to be noted that an input data string at the time of t=0 to t=5 in this case is the same as that illustrated in FIG. 11.

In FIG. 13, whether each code word belongs to the code word set S1 or the code word set S2 is also illustrated. In addition, in FIG. 13, a connection condition for each code word (t=0 to t=4) under which the run-length limitations are satisfied is also illustrated. With respect to the connection condition, Condition 1 indicates that only the code word $CS1_t$ satisfies the run-length limitations when connected to the code word $C_{t-1}$. Condition 2 indicates that only the code word $CS2_t$ satisfies the run-length limitations when connected to the code word $C_{t-1}$. Condition 3 indicates that both the code words $CS1_t$ and $CS2_t$ satisfy the run-length limitations when connected to the code word $C_{t-1}$.

At the time of t=1, for example, the input data word is "0xfa". According to FIG. 5 mentioned above, the result ($CS1_t$) obtained by encoding the data word "0xfa" using the S1 encoding table 11 is "0100000001000000". The result ($CS2_t$) obtained by encoding the data word "0xfa" using the S2 encoding table 12 is "0010010010010010" (refer to FIG. 8).

When these code words are connected to a code word "0100000001001001", which is the previous code word at the time of t=0, it can be seen that only the code word $CS2_t$ satisfies the run-length limitations. Therefore, the connection condition in this case is "Condition 2" as illustrated in FIG. 13, and the code word $CS2_t$ "0010010010010010" is output.

On the other hand, at the time of t=2, for example, the result ($CS1_t$) obtained by encoding an input data word "0xf8" using the S1 encoding table 11 is "0100000010000000" (refer to FIG. 5). The result ($CS2_t$) obtained by encoding the input data word "0xf8" using the S2 encoding table 12 is "0000010001001001" (refer to FIG. 8).

When the code words $CS1_t$ and $CS2_t$ are connected to the code word "0010010010010010", which is the previous code word at the time of t=1, it can be seen that both the code words $CS1_t$ and $CS2_t$ satisfy the run-length limitations. Therefore, the connection condition in this case is "Condition 3" as illustrated in FIG. 13, and the code word $CS1_t$ "0100000010000000", which has a lower occurrence than the code word $CS2_t$, can be output.

Whereas the occurrences at the time of t=0 to t=5 are 4, 5, 4, 4, 3, and 3, respectively, in the case of the comparative example illustrated in FIG. 11, those in this embodiment are 4, 5, 2, 3, 3, and 3.

Therefore, it can be understood that the number of symbols "1" can be sparse in a recording code string by executing the coding with the sparse control according to this embodiment.

1-5. Decoding Process

A method for decoding a code string generated by the above-described encoding according to this embodiment into a data string will be described hereinafter.

According to the definitions of the S1 code word set and the S2 code word set described above, it can be seen that the same code word is not stored in both the S1 encoding table 11 and the S2 encoding table 12 in this embodiment. This means that a data word can be uniquely obtained from the two tables, namely the S1 encoding table 11 and the S2 encoding table 12.

More specifically, decoding in this case may be executed in the following manner.

That is, first, as the S1 decoding table 22 and the S2 decoding table 23, a table in which the correspondence between the data words and the code words in the S1 encoding table 11 is stored and a table in which the correspondence between the data words and the code words in the S2 encoding table 12 is stored are used, respectively.

For each n-bit code word in a recording code string input from the Viterbi decoder 20, the decoder 21 searches the S1 decoding table 22 and the S2 decoding table 23 in order to identify the corresponding m-bit data word. Identified data words are sequentially output as playback data. Table lookup at this time can be realized with a circuit such as a wired OR.

In the encoding executed in EFM plus (refer to "EFMPlus: THE CODING FORMAT OF THE MULTIMEDIA COMPACT DISC" and International Publication No. 95/22802 mentioned above), on the one hand, the same code word exists in the same state, and an increase in the number of elements (code words) in a code word set is realized by assigning the code word to a data word depending on the next state. Therefore, when decoding is executed, it is necessary to decode a code word depending on the state of the previous code word.

For this reason, in EFM plus, propagation of errors, where a decoding operation fails when there is an error in the previous decoding operation, can occur.

On the other hand, in this embodiment, all the code words in the S1 code word set and the S2 code word set are independent, and all the elements obtained by combining the S1 code word set and the S2 code word set are also independent. This means that a common set does not exist between the S1 code word set and the S2 code word set.

As can be seen by referring to FIGS. 3 to 8, in this embodiment, all the code words in the S1 code word set and the S2 code word set correspond to the data words in a one-to-one manner.

For this reason, in this embodiment, unlike in the case of EFM plus, decoding can be executed without considering a set to which a code word belongs. That is, since decoding of a certain code word does not depend on the state of the previous code word, decoding without propagation of errors can be realized.

1-6. Effects Produced by Encoding According to First Embodiment

Figure 14:
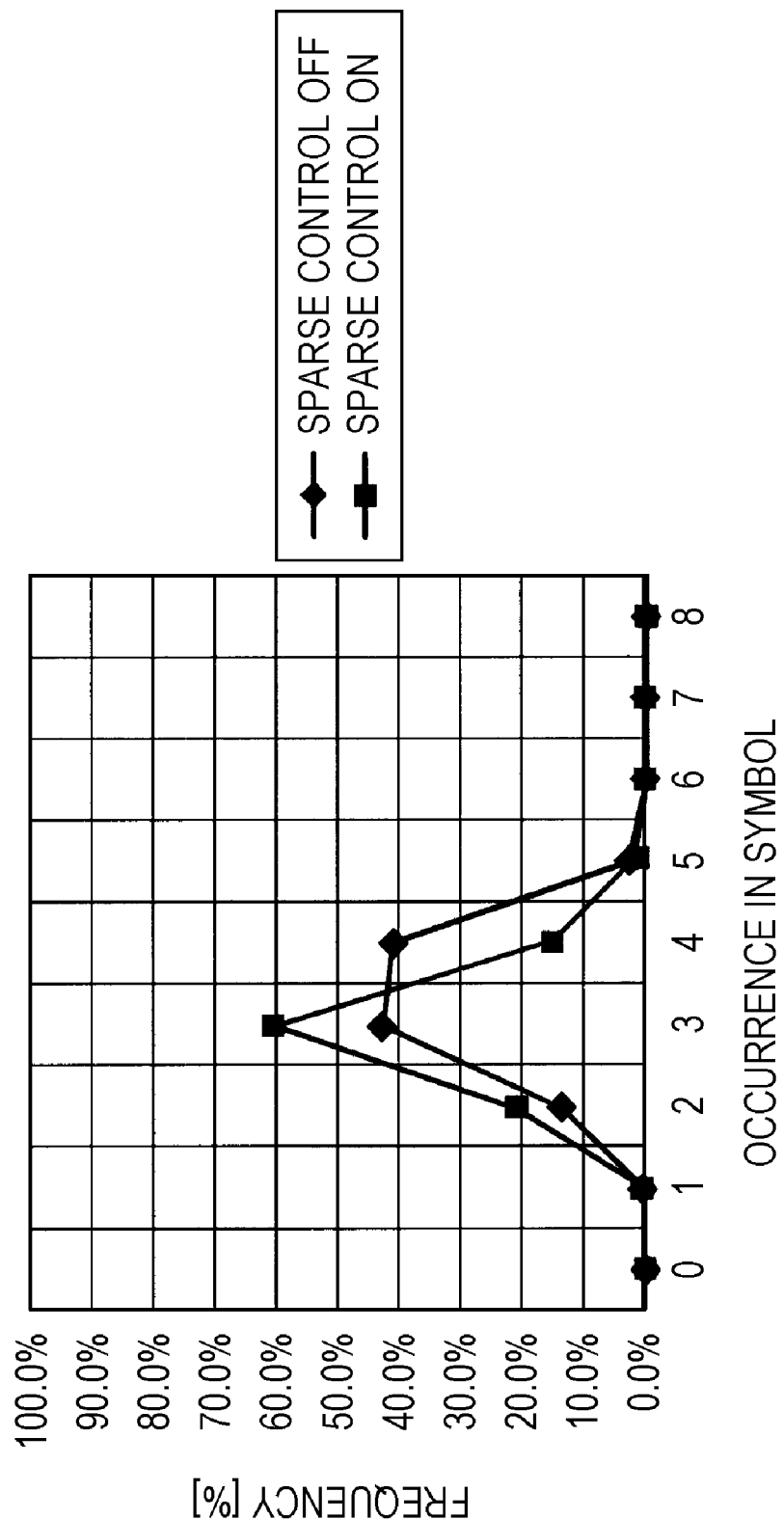
FIG. 14 is a graph illustrating 10,000,000 code words obtained by performing encoding according to the first embodiment.

FIG. 14 is a graph illustrating the occurrences of 10,000,000 code words when the encoding according to the first embodiment has been executed.

In FIG. 14, the results of the encoding executed with the sparse control according to the first embodiment are represented by plotting squares, and the results of the encoding executed without the sparse control in the comparative example are represented by plotting diamonds.

It can be seen from the results illustrated in FIG. 14 that the number of code words whose occurrences are 4 or more can be reduced and the number of code words whose occurrences are 2 or 3 can be increased by the sparse control according to this embodiment.

Figure 15:
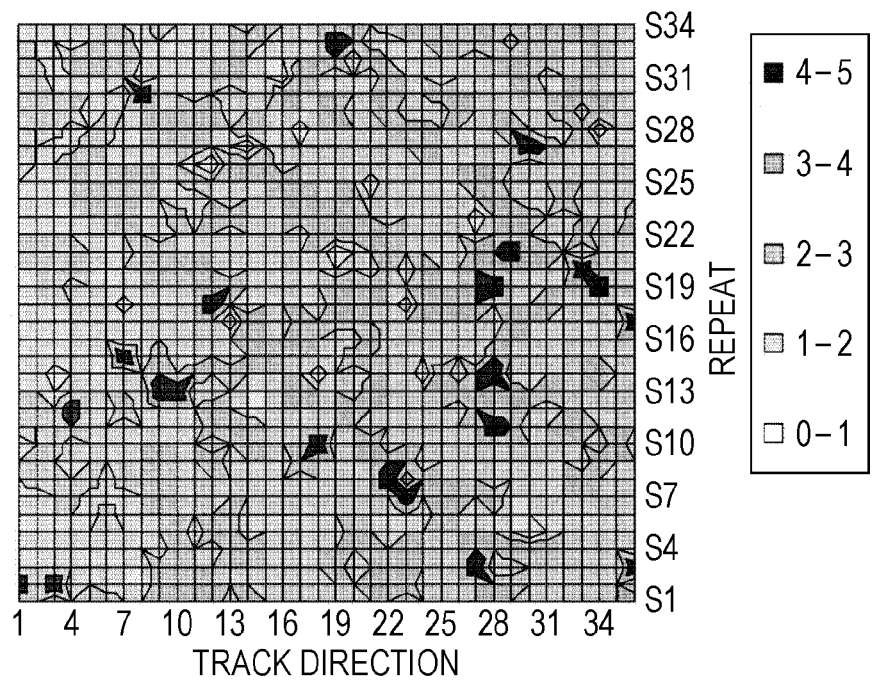
FIG. 15 is a contour map illustrating the occurrence obtained by performing the encoding according to the first embodiment.
Figure 16:
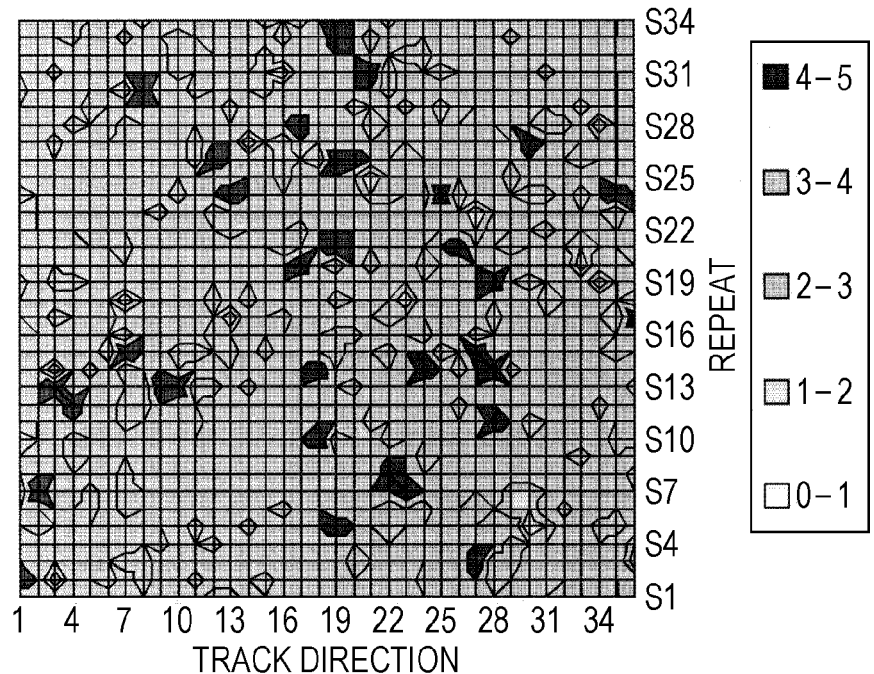
FIG. 16 is a contour map illustrating the occurrence obtained by performing the encoding in the comparative example.

In addition, FIG. 15 illustrates a contour map of the occurrences when the encoding according to the first embodiment has been executed. FIG. 16 illustrates a contour map of the occurrences when the encoding in the comparative example has been executed.

FIGS. 15 and 16 illustrate maps obtained by tracing thirty-four occurrences from the left to the right and by sequentially tracing a total of thirty-four lines in the same manner. The depth of the color indicates the degree of occurrence. The lighter the color, the lower the occurrence.

By comparing FIGS. 15 and 16, it can be seen that symbols "1" are more sparse in this embodiment, where the sparse control is performed, than in the case of FIG. 16, where the sparse control is not performed.

Figure 35A:
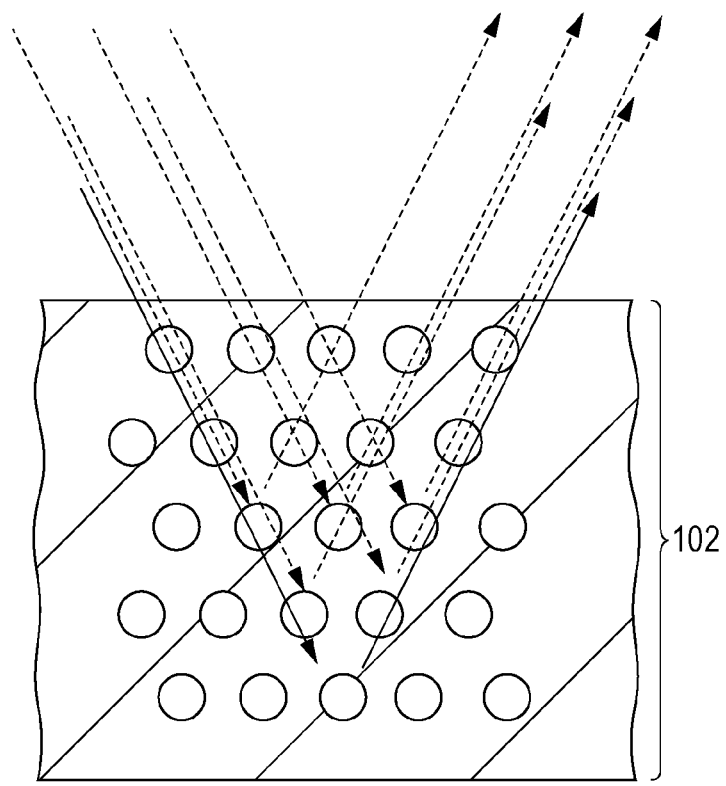
FIGS. 35A and 35B are diagrams for illustrating an advantage of encoding a bulk recording medium such that the number of symbols "1" in a recording code is sparse.
Figure 35B:
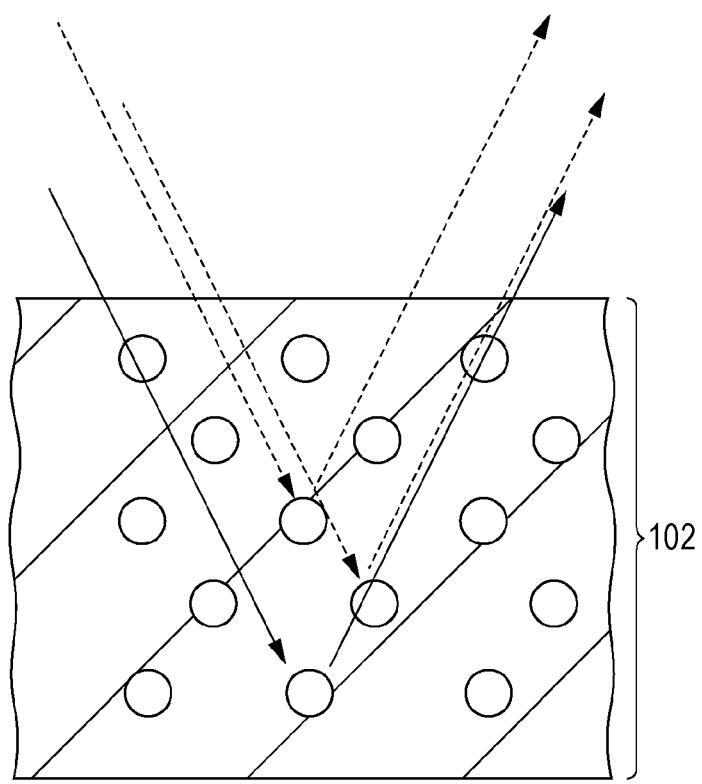

Thus, by realizing the sparse encoding, that is, by realizing the encoding by which symbols "1" in code words become sparse, interlayer cross-talk can be effectively suppressed when mark position recording is performed on a bulk optical recording medium, as can be seen by referring to FIGS. 35A and 35B.

2. Second Embodiment

2-1. Example of Encoding Table

A second embodiment is different from the first embodiment, where m is assumed to be 8 and n is assumed to be 16, that is, the encoding ratio is 1/2, in that m is assumed to be 16 and n is assumed to be 31.

It is to be noted that, in the second embodiment, the structure of the bulk recording medium 1 and the configuration of the recoding/playback apparatus are the same as those in the first embodiment, and therefore redundant description thereof with reference to the drawings is omitted.

In addition, in the second embodiment, the method for executing encoding is the same as that illustrated in FIG. 12 except for the encoding ratio, and therefore redundant description thereof with reference to the drawings is omitted.

In addition, in the second embodiment, too, the run-length limitations are d=2 and k=10.

In the second embodiment, an encoding table is generated in the following manner.

First, there are 84,321 31-bit binary code words that begin with a symbol "1" or "01", that satisfy the run-length limitations of d=2 and k=10 between symbols "1" which appear halfway, and that end with a symbol "1" or nine or less consecutive symbols "0".

In this code word set, 65,536 ($=2^{16}$) code words whose occurrences are relatively low will be referred to as an "S1 code word set" in the second embodiment.

Furthermore, in the S1 code word set, a set of code words that end with two or more and nine or less consecutive symbols "0" are categorized into "S11" and a set of code words that end with a symbol "1" or "10" are categorized into "S12".

On the other hand, there are 71,599 31-bit binary code words that begin with two or more and nine or less consecutive symbols "0", that satisfy the run-length limitations of d=2 and k=10 between symbols "1" which appear halfway, and that end with a symbol "1" or nine or less consecutive symbols "0".

In this code word set, 65,536 code words whose occurrences are relatively low will be referred to as an "S2 code word set".

Furthermore, in the S2 code word set, a set of code words that end with two or more and nine or less symbols "0" are categorized into "S21" and a set of code words that end with a symbol "1" or "10" are categorized into "S22".

In this case, the code words that belong to the S1 code word set are associated with data words ($2^{16}$ data words) and stored in the S1 encoding table 11. In addition, the code words that belong to the S2 code word set are associated with the data words and stored in the S2 encoding table 12.

In addition, in the second embodiment, as in the case of the first embodiment, the code words in the S1 encoding table 11 are arranged in order of descending occurrence and associated with the data words, and the code words in the S2 encoding table 12, in contrast, are associated with the same data words in order of ascending occurrence.

In doing so, a data word with which a code word having a higher occurrence is associated in the S1 encoding table 11 is associated with a code word having a lower occurrence in the S2 encoding table 12. In contrast, a data word with which a code word having a lower occurrence is associated in the S1 encoding table 11 is associated with a code word having a higher occurrence in the S2 encoding table 12.

Figure 22:
FIG. 22 is a diagram illustrating an example (continuation) of the data structure of the S2 encoding table according to the second embodiment.

FIGS. 17 to 19 illustrate the data structure of the S1 encoding table 11 according to the second embodiment, and FIGS. 20 to 22 illustrate the data structure of the S2 encoding table 12 according to the second embodiment.

In FIGS. 17 to 22, too, the "Data" column indicates data words (in hexadecimal notation), and the "Code" column indicates code words. The "Occ" column indicates occurrences, and the "State" column indicates the "State" values of the code words.

In the second embodiment, the encoding ratio (m/n) is 16/31. Compared to the first embodiment, where the encoding ratio is 8/16, an improvement of about 3.2% can be realized.

That is, in the second embodiment, data capacity in which data can be written on the bulk recording medium 1 can be increased by 3.2% from the encoding according to the first embodiment.

It is to be noted that the decoding method in this case is the same as that in the first embodiment.

That is, as the S1 decoding table 22 and the S2 decoding table 23, a table in which the correspondence between the data words and the code words in the S1 encoding table 11 (illustrated in FIGS. 17 to 19) is stored and a table in which the correspondence between the data words and the code words in the S2 encoding table 12 (illustrated in FIGS. 20 to 22) is stored are used, respectively. For each n-bit code word in a recording code string input from the Viterbi decoder 20, the decoder 21 searches the S1 decoding table 22 and the S2 decoding table 23 in order to identify the corresponding m-bit data word. Data words identified by the search are sequentially output as playback data.

2-2. Effects Produced by Encoding According to Second Embodiment

Figure 23:
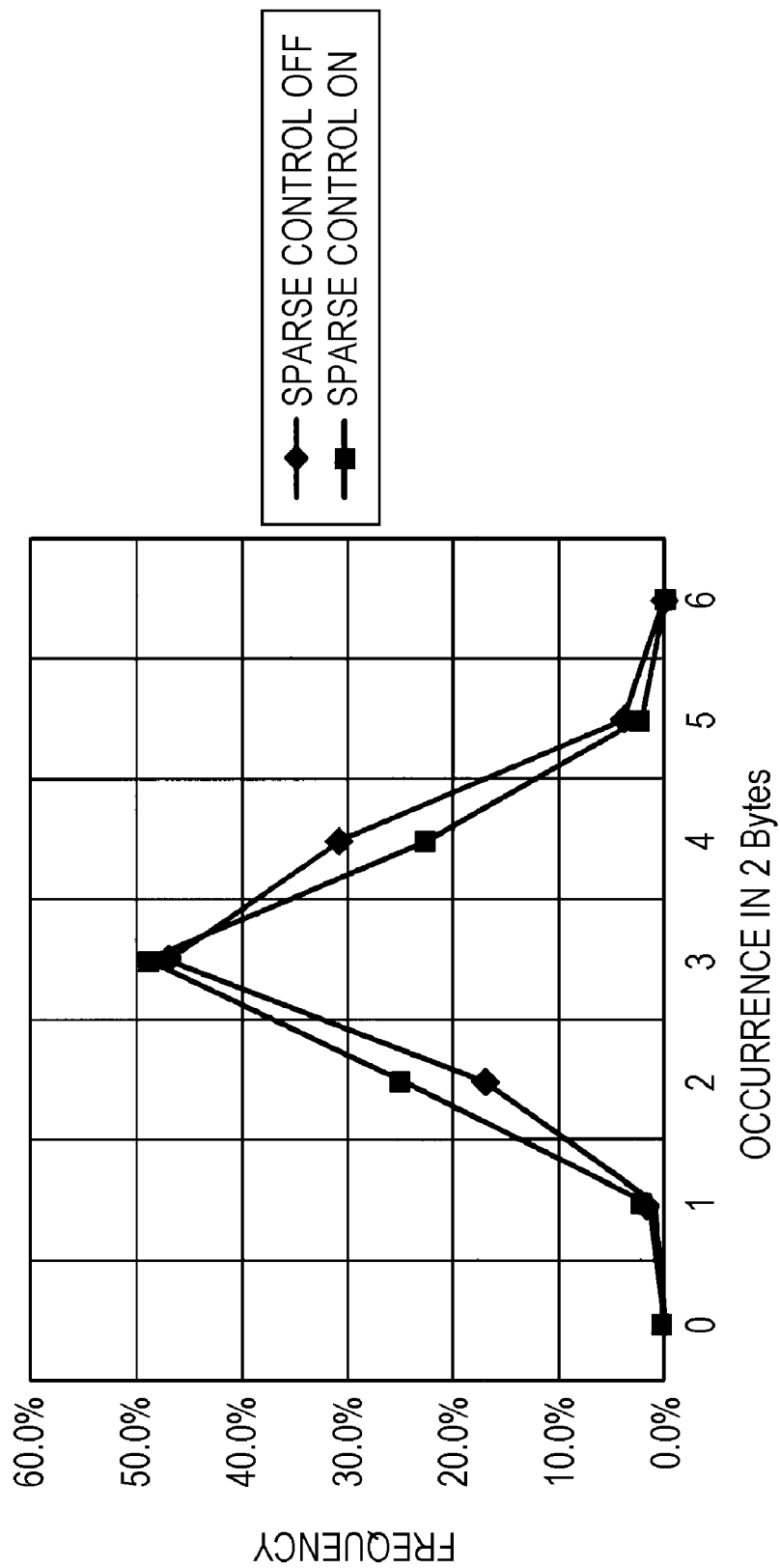
FIG. 23 is a graph illustrating 10,000,000 code words obtained by performing encoding according to the second embodiment.

FIG. 23 is a graph illustrating the occurrences of 10,000,000 code words when the encoding according to the second embodiment has been executed.

In FIG. 23, the results of the encoding executed with the sparse control according to this embodiment, which is the encoding with the encoding ratio of 16/31 using the S1 encoding table 11 and the S2 encoding table 12 illustrated in FIGS. 17 to 22, are represented by plotting squares, and the results of the encoding executed without the sparse control in the comparative example are represented by plotting diamonds.

It can be seen from the results illustrated in FIG. 23 that, in the case of the encoding ratio of 16/31, too, the number of code words whose occurrences are 4 or more can be reduced and the number of code words whose occurrences are 2 or 3 can be increased by the sparse control according to this embodiment.

Figure 24:
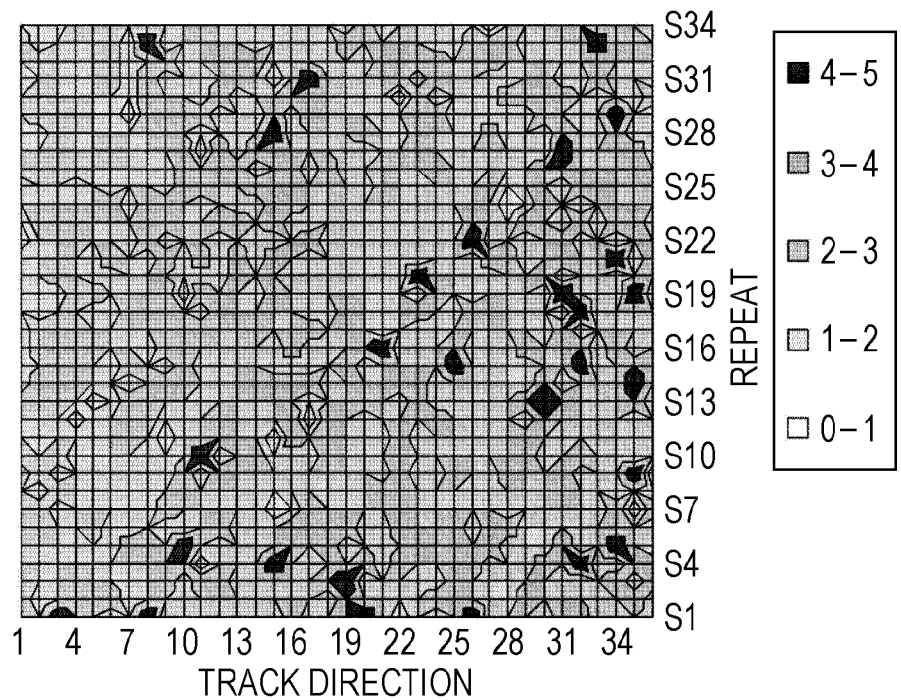
FIG. 24 is a contour map illustrating the occurrence obtained by performing the encoding according to the second embodiment.
Figure 25:
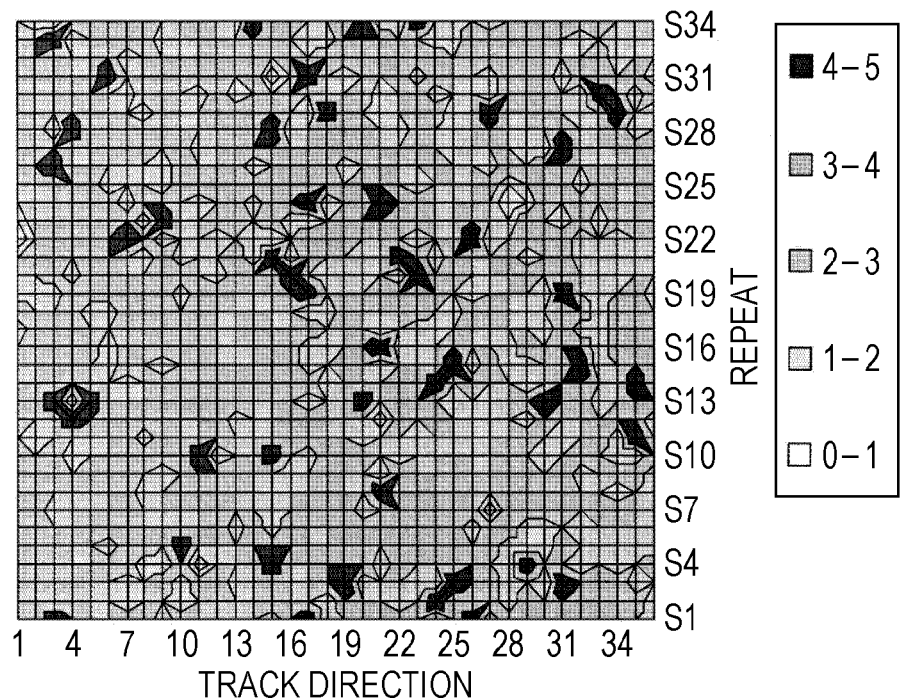
FIG. 25 is a contour map illustrating the occurrence obtained by performing the encoding in the comparative example.

In addition, FIG. 24 illustrates a contour map of the occurrences when the encoding according to the second embodiment has been executed. FIG. 25 illustrates a contour map of the occurrences when the encoding in the comparative example (an encoding ratio of 16/31) has been executed.

As in the cases of FIGS. 15 and 16, FIGS. 24 and 25 illustrate maps obtained by tracing thirty-four occurrences from the left to the right and by sequentially tracing a total of thirty-four lines in the same manner. The depth of the color indicates the degree of occurrence. The lighter the color, the lower the occurrence.

By comparing FIGS. 24 and 25, it can be seen that, in the case of the encoding ratio of 16/31, too, symbols "1" are more sparse when the sparse control according to this embodiment is performed than when the sparse control is not performed.

Thus, in the second embodiment, too, where the encoding ratio is 16/31, the sparse encoding can be realized. As a result, interlayer cross-talk can be effectively suppressed for the bulk recording medium 1 that performs multilayer mark position recording inside the bulk layer 5.

3. Third Embodiment 3-1. Example of Encoding Table

Although the methods for executing encoding and decoding with the run-length limitation of d=2 have been described in the first and second embodiments, a method for executing encoding and decoding with a run-length limitation of d=3 will be proposed in a third embodiment.

Here, when a method for performing mark position recording is adopted, which is the case in the embodiments, if d is assumed to be 2 as in the first and second embodiments, it may be difficult to realize dense recording. That is, if d is 2, the shortest distance between marks is relatively small, which may increase the possibility that marks fuse into a single mark and therefore appropriate recording is not performed.

It has been found out that when, in particular, a void recording method for forming void marks is adopted as a bulk recording method, voids separated by the shortest distance are likely to fuse into a single void.

On the other hand, if the value of d is made large and accordingly the shortest distance between marks becomes large, the window margin is reduced, which may make it difficult to generate the clock signals CLK appropriately.

In consideration of these points, d is set to 3 in the third embodiment.

Here, the value of k of the run-length limitations is preferably smaller in terms of the efficiency of encoding.

In addition, in consideration of the encoding ratio (recording density), the value of n is preferably smaller, too.

In consideration of these points, k is set to 13 and encoding is executed such that m/n is 16/37 in this embodiment. That is, the conditions set for d, k, m, and n in this embodiment are d=3, k=13, m=16, and n=37.

Because the Shannon limit is 0.4583 when d is 3 and k is 13, the coding efficiency in this embodiment is 94.4%.

In the third embodiment, the encoding table is generated in the following manner.

It is to be noted that, in the third embodiment, too, the structure of the bulk recording medium 1 and the configuration of the recoding/playback apparatus are the same as those in the first embodiment, and therefore redundant description thereof with reference to the drawings is omitted.

In addition, in the third embodiment, the method for executing the encoding is the same as that illustrated in FIG. 12 except for the encoding ratio and the run-length limitations regarding d and k, and therefore redundant description thereof with reference to the drawings is omitted.

First, there are 118,586 37-bit binary code words that begin with zero to two consecutive symbols "0" and that satisfy the run-length limitations of d=3 and k=13.

In this code word set, 65,536 ($=2^{16}$) code words whose occurrences are relatively low will be referred to as an "S1 code word set" in the third embodiment.

On the other hand, there are 70,161 37-bit binary code words that begin with three to eleven consecutive symbols "0" and that satisfy the run-length limitations of d=3 and k=13.

In this code word set, 65,536 code words whose occurrences are relatively low will be referred to as an "S2 code word set" in the third embodiment.

In this case, the code words that belong to the S1 code word set are associated with data words ($2^{16}$ data words) and stored in the S1 encoding table 11. In addition, the code words that belong to the S2 code word set are associated with the data words an stored in the S2 encoding table 12.

In addition, as in the cases of the first and second embodiments, the code words in the S1 encoding table 11 are arranged in order of descending occurrence and associated with the data words, and the code words in the S2 encoding table 12, in contrast, are associated with the same data words in order of ascending occurrence in the third embodiment.

In doing so, in this case, too, a data word with which a code word having a higher occurrence is associated in the S1 encoding table 11 is associated with a code word having a lower occurrence in the S2 encoding table 12. In contrast, a data word with which a code word having a lower occurrence is associated in the S1 encoding table 11 is associated with a code word having a higher occurrence in the S2 encoding table 12.

Figure 29:
FIG. 29 is a diagram illustrating an example (continuation) of the data structure of the S2 encoding table according to the third embodiment.

FIGS. 26 and 27 illustrate the data structure of the S1 encoding table 11 according to the third embodiment, and FIGS. 28 and 29 illustrate the data structure of the S2 encoding table 12 according to the third embodiment.

In FIGS. 26 to 29, too, the "Data" column indicates data words (in hexadecimal notation), and the "Code" column indicates code words. The "Occ" column indicates occurrences, and the "State" column indicates the "State" values of the code words.

In this case, a "State" value of 1 indicates a code word that ends with three or more and eleven or less consecutive symbols "0". A "State" value of 2 indicates a code word that ends with a symbol "1", "10", or "100".

In the third embodiment, by setting d to 3, fusion between marks can be securely prevented, especially when the void recording method is adopted. Furthermore, compared to a case in which d is set to 4 or more, the window margin can be increased, thereby making it possible to steadily generate the clock signals CLK.

It is to be noted that the decoding method in this case is the same as those in the first and second embodiments.

That is, as the S1 decoding table 22 and the S2 decoding table 23, a table in which the correspondence between the data words and the code words in the S1 encoding table 11 (illustrated in FIGS. 26 and 27) is stored and a table in which the correspondence between the data words and the code words in the S2 encoding table 12 (illustrated in FIGS. 28 and 29) is stored are used, respectively. For each n-bit code word in a recording code string input from the Viterbi decoder 20, the decoder 21 searches the S1 decoding table 22 and the S2 decoding table 23 in order to identify the corresponding m-bit data word. Data words identified by the search are sequentially output as playback data.

3-2. Effects Produced by Encoding According to Third Embodiment

Figure 30:
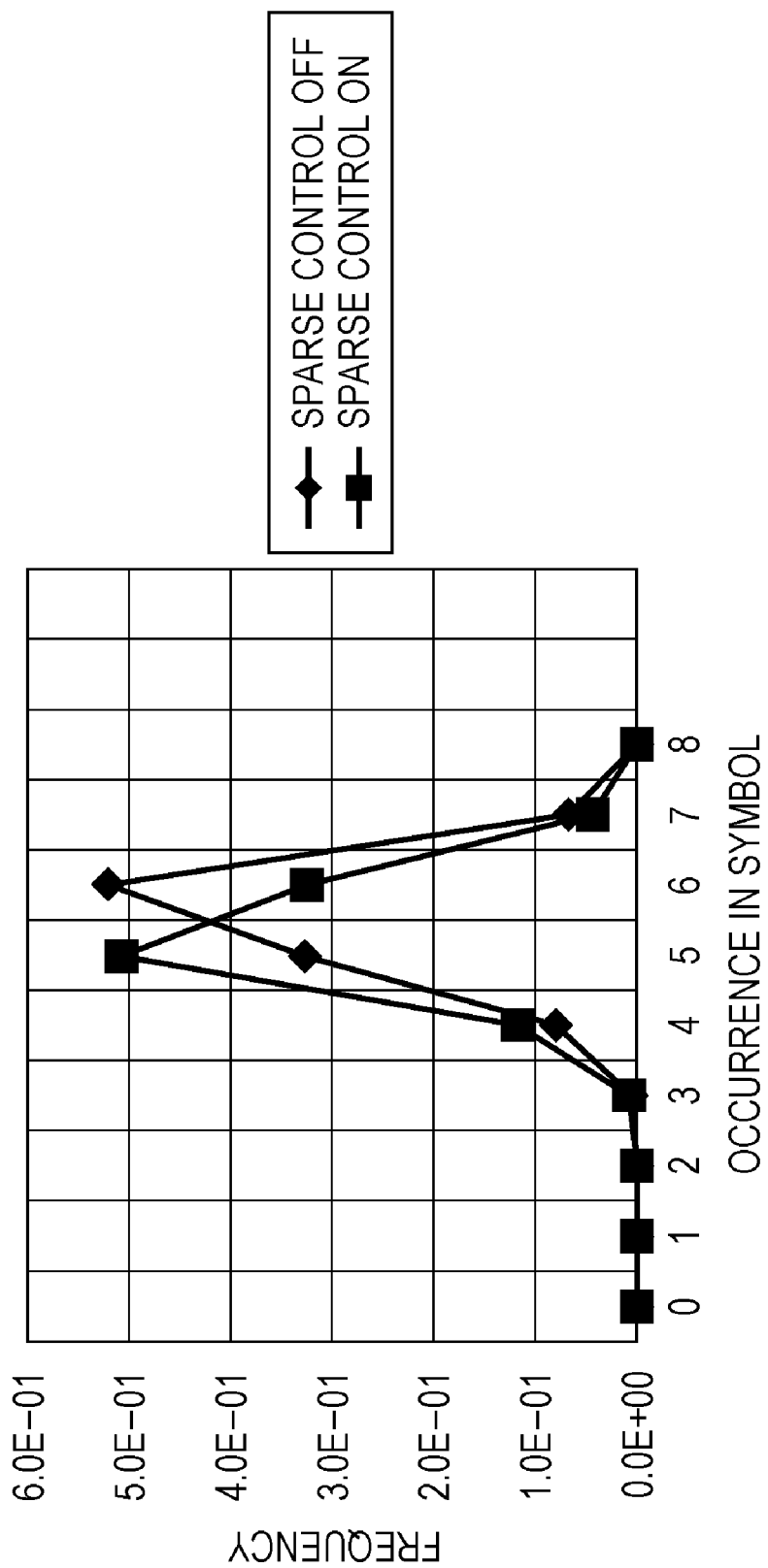
FIG. 30 is a graph illustrating the occurrence obtained by performing encoding according to the third embodiment.

FIG. 30 is a graph illustrating the occurrences that are obtained when the encoding according to the third embodiment has been executed.

In FIG. 30, the results of the encoding executed with the sparse control according to this embodiment, which is the encoding with the encoding ratio of 16/37 using the S1 encoding table 11 and the S2 encoding table 12 illustrated in FIGS. 26 to 29, are represented by plotting squares, and the results of the encoding executed without the sparse control (hereinafter referred to as a comparative example in this embodiment) using the S1 encoding table 11 and the S2 encoding table 12 are represented by plotting diamonds.

It can be seen from the results illustrated in FIG. 30 that, in the case of d=3, k=13, m=16, and n=37, the number of code words whose occurrences are 6 or more can be reduced and the number of code words whose occurrences are 4 or 5 can be increased by the sparse control according to this embodiment.

Figure 31:
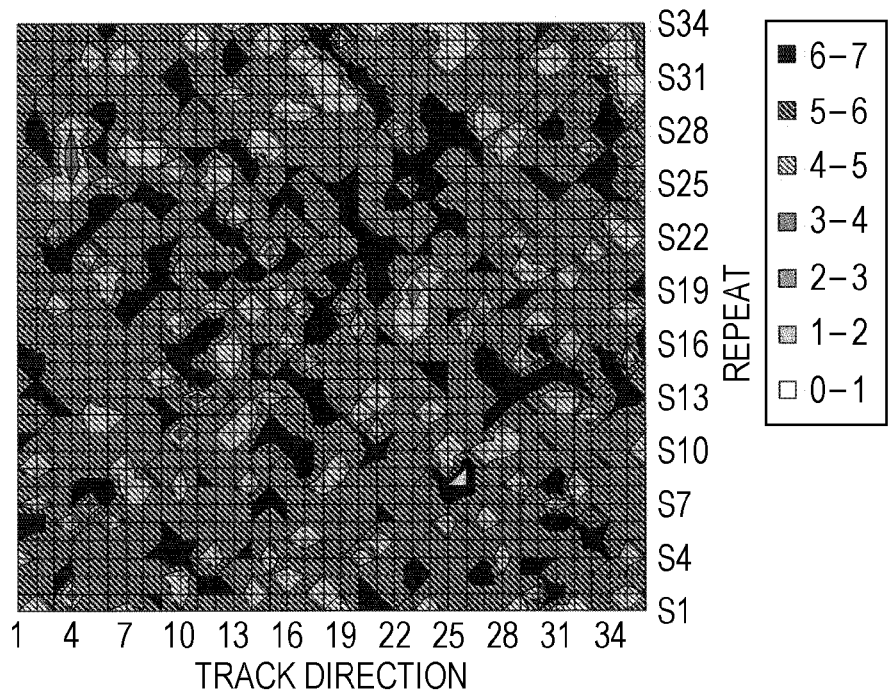
FIG. 31 is a contour map illustrating the occurrence obtained by performing the encoding according to the third embodiment.
Figure 32:
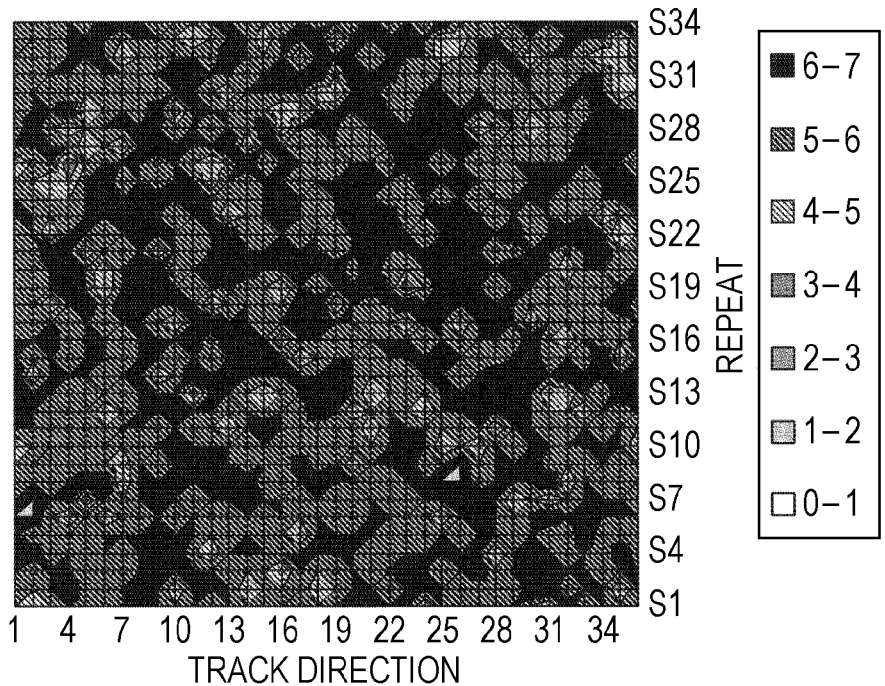
FIG. 32 is a contour map illustrating the occurrence obtained by performing the encoding in the comparative example.
Figure 33:
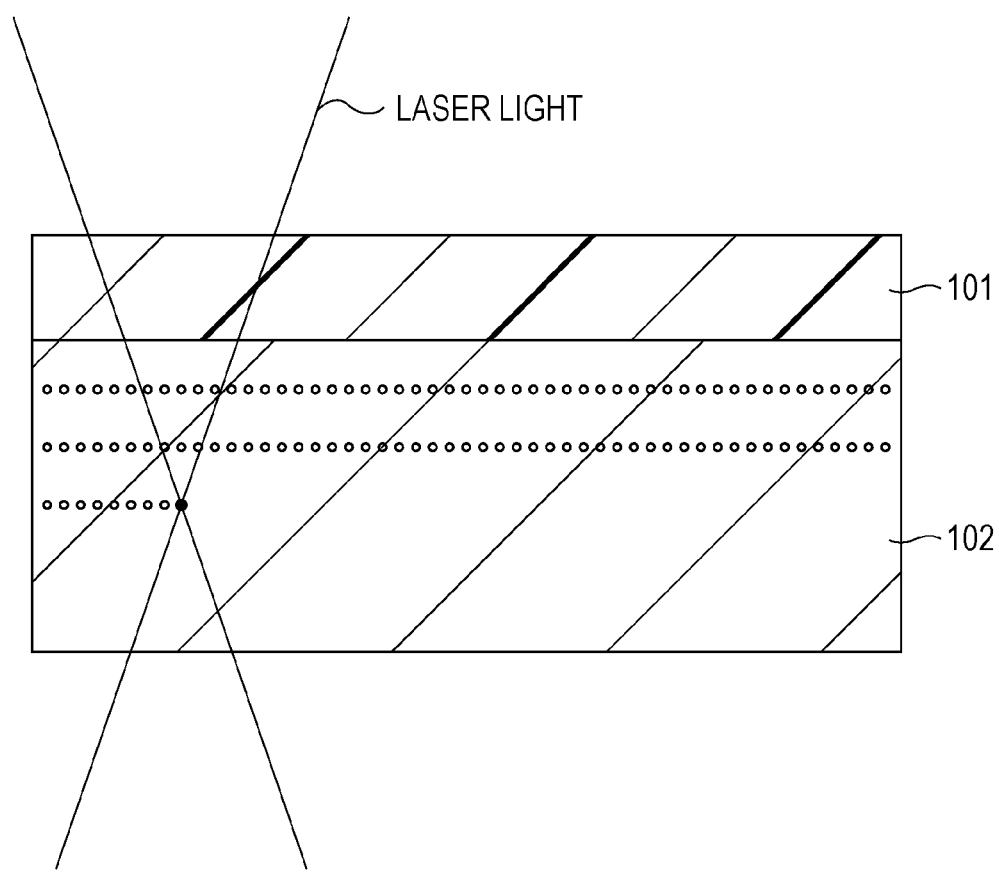
FIG. 33 is a diagram for illustrating a bulk recording method.

In addition, FIG. 31 illustrates a contour map of the occurrences when the encoding according to the third embodiment has been executed. FIG. 32 illustrates a contour map of the occurrences when the encoding in the comparative example (without the sparse control) has been executed.

FIGS. 31 and 32 illustrate maps obtained by tracing thirty-six occurrences from the left to the right and by sequentially tracing a total of thirty-six lines in the same manner. The relationship between the depth of the color and the pattern (sparse or dense oblique lines) and the occurrences is as illustrated in FIGS. 31 and 32.

By comparing FIGS. 31 and 32, it can be seen that, in the third embodiment, too, where d is 3, k is 13, m is 16, and n is 37, symbols "1" are more sparse when the sparse control according to this embodiment is performed than when the sparse control is not performed. That is, interlayer cross-talk can be effectively suppressed.

4. Modifications

Although the embodiments of the present invention have been described, the present invention is not limited to the specific examples described above.

For example, the encoding ratio is not limited to 8/16, 16/31, and 16/37 that have been described above.

As can be seen from the above description, in the encoding executed in these cases, it is at least necessary for the code words in the S1 encoding table 11 and the code words in the S2 encoding table 12 that are associated with the same data words not to overlap with each other. In this sense, the relationship between m and n at least satisfies the expression $2^n \geq 2^m \times 2$.

In addition, although a case in which the run-length limitations are d=2 and k=10 or d=3 and k=13 has been described above, the values of d and k are not limited to these. Needless to say, the present invention can be preferably applied even when the run-length limitations are different from those described above.

In addition, in the above description, the connections between the code words $CS1_t$ and $CS2_t$ that have been encoded using the S1 encoding table 11 and the S2 encoding table 12, respectively, and the previous code word $C_{t-1}$ are confirmed and, only when both the code words $CS1_t$ and $CS2_t$ satisfy the run-length limitations, a code word having a smaller number of symbols "1" is selectively output. However, when, for example, the recording density is relatively small and therefore it is not necessary to provide a run-length limitation, a configuration in which, from between a code word encoded using the S1 encoding table 11 and a code word encoded using the S2 encoding table 12, a code word having a smaller number of symbols "1" is selectively output for each input of m-bit recording data.

In addition, although a case in which the encoding apparatus (encoding method) and the recording apparatus (recording method) according to an embodiment of the present invention are applied to a recording/playback apparatus that performs both mark recording and playback of recorded marks has been described above, needless to say, the encoding apparatus (encoding method) and the recording apparatus (recording method) according to an embodiment of the present invention may be preferably applied to a recording apparatus (recording-only apparatus) that performs only mark recording onto a recording layer.

In addition, although a case in which the decoding apparatus (decoding method) according to an embodiment of the present invention is applied to a recording/playback apparatus that performs both mark recording and playback of recorded marks has been described above, needless to say, the decoding apparatus (decoding method) according to an embodiment of the present invention may be preferably applied to a playback apparatus (playback-only apparatus) that performs only playback of recorded marks.

In addition, the recording/playback apparatus according to the above embodiments is configured to include the S1 encoding table 11 and the S2 encoding table 12 in the encoder 10 thereof and the S1 decoding table 22 and the S2 decoding table 23 in the decoder 21 thereof. However, in this case, the encoder 10 may share the S1 encoding table 11 and the S2 encoding table 12 with the decoder 21 for the decoding process. That is, it is not necessary for the S1 decoding table 22 and the S2 decoding table 23 to be independent from the S1 encoding table 11 and the S2 encoding table 12. In other words, the S1 encoding table 11 and the S2 encoding table 12 may also serve as the S1 decoding table 22 and the S2 decoding table 23.

The present application contains subject matter related to that disclosed in Japanese Priority Patent Application JP 2010-106591 filed in the Japan Patent Office on May 6, 2010 and Japanese Priority Patent Application JP 2010-274548 filed in the Japan Patent Office on Dec. 9, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An encoding apparatus to convert m-bit data words into n-bit code words, where m and n are both integers and satisfy an expression $2^n \geq 2^m \times 2$, the encoding apparatus comprising:
    a first conversion table in which $2^m$ m-bit data words are associated with $2^m$ n-bit code words selected from $2^n$-bit code words;
    a second conversion table in which $2^m$ m-bit data words are associated with $2^m$ n-bit code words that have been selected from the $2^n$ n-bit code words and that do not overlap with the $2^m$ n-bit code words in the first conversion table; and
    an encoder configured to select and output a first n-bit code word, with which an m-bit data word that has been input is associated, in the first conversion table or a second n-bit code word, with which the m-bit data word that has been input is associated, in the second conversion table, the selected and output n-bit code word having a smaller number of symbols "1" between the first and second n-bit code words.

2. The encoding apparatus according to claim 1,
wherein an m-bit data word associated with an n-bit code word having a large number of symbols "1" in the first conversion table is associated with an n-bit code word having a small number of symbols "1" in the second conversion table, and an m-bit data word associated with an n-bit code word having a small number of symbols "1" in the first conversion table is associated with an n-bit code word having a large number of symbols "1" in the second conversion table.

3. The encoding apparatus according to claim 2,
wherein the encoder is configured to select the n-bit code word in such a way that, in a code string obtained as a result of encoding, run-length limitations of a number d of consecutive symbols "0", where d≠0, and a largest number k of consecutive symbols "0", where k >d, are satisfied.

4. The encoding apparatus according to claim 3,
wherein the encoder is configured to convert the m-bit data words that have been input into the first code word and the second code word using the first conversion table and the second conversion table, respectively, and
wherein, when the first code word and the second code word are connected to a previous code word that has been output, it is judged whether both the first code word and the second code word satisfy the run-length limitations, and if the first code word and the second code word satisfy the run-length limitations, the encoder selects and outputs the first code word or the second code word, the selected and output code word having the smaller number of symbols "1".

5. The encoding apparatus according to claim 4,
wherein d is 2, k is 10, and an encoding ratio m/n is 1/2.

6. The encoding apparatus according to claim 5,
wherein m is 8 and n is 16.

7. The encoding apparatus according to claim 6,
wherein, from among 16-bit code words, $2^8$ code words that have a small number of symbols "1" in a code word set, in which 16-bit code words begin with a symbol "1" or "01" and satisfy the run-length limitations, are stored in the first conversion table, and
wherein, from among the 16-bit code words, $2^8$ code words, which begin with two or more and nine or less consecutive symbols "0" and satisfy the run-length limitations, are stored in the second conversion table.

8. The encoding apparatus according to claim 4,
wherein d is 2, k is 10, m is 16, and n is 31.

9. The encoding apparatus according to claim 8,
wherein, from among 31-bit code words, $2^{16}$ code words, which have a small number of symbols "1" in a code word set in which 31-bit code words begin with a symbol "1" or "01" and satisfy the run-length limitations, are stored in the first conversion table, and
wherein, from among the 31-bit code words, $2^{16}$ code words, which have a small number of symbols "1" in a code word set in which code words begin with two or more and nine or less consecutive symbols "0" and satisfy the run-length limitations, are stored in the second conversion table.

10. The encoding apparatus according to claim 4,
wherein d is 3, k is 13, m is 16, and n is 37.

11. The encoding apparatus according to claim 10,
wherein, from among 37-bit code words, $2^{16}$ code words, which have a small number of symbols "1" in a code word set in which 37-bit code words begin with zero to two consecutive symbols "0" and satisfy the run-length limitations, are stored in the first conversion table, and
wherein, from among the 37-bit code words, $2^{16}$ code words that have a small number of symbols "1" in a code word set in which 37-bit code words begin with three to eleven consecutive symbols "0" and satisfy the run-length limitations are stored in the second conversion table.

12. An encoding method for converting m-bit data words into n-bit code words, where m and n are both integers and satisfy an expression $2^n \geq 2^m \times 2$, the encoding method comprising the step of:
executing encoding for an m-bit data word that has been input, where a first n-bit code word is selected and output from a first conversion table in which $2^m$ m-bit data words are associated with $2^m$ n-bit code words selected from $2^n$ n-bit code words or from a second conversion table in which $2^m$ m-bit data words are associated with $2^m$ n-bit code words that have been selected from the $2^n$ n-bit code words and do not overlap with the $2^m$ n-bit code words in the first conversion table, the selected and output n-bit code word having a smaller number of symbols "1" between n-bit code words that may be selected, based on the m-bit data word, from the first and second conversion tables.

13. A recording apparatus to convert m-bit data words into n-bit code words, where m and n are both integers and satisfy an expression $2^n \geq 2^m \times 2$, and to perform recording on an optical recording medium, the recording apparatus comprising:
a first conversion table in which $2^m$ m-bit data words are associated with $2^m$ n-bit code words selected from $2^n$ n-bit code words;
a second conversion table in which $2^m$ m-bit data words are associated with $2^m$ n-bit code words that have been selected from the $2^n$ -bit code words and that do not overlap with the $2^m$ n-bit code words in the first conversion table;
an encoder configured to select and output a first n-bit code word with which an m-bit data word that has been input is associated in the first conversion table or a second n-bit code word with which the m-bit data word that has been input is associated in the second conversion table, the selected and output n-bit code word having a smaller number of symbols "1" between the first and second n-bit code words; and
a recorder configured to perform recording on the optical recording medium at least in part on the basis of the n-bit code word output from the encoder.

14. The recording apparatus according to claim 13,
wherein the recorder performs recording on the optical recording medium while using a symbol "1" in the n-bit code word as a mark and a symbol "0" in the n-bit code word as a space.

15. The recording apparatus according to claim 13,
wherein the optical recording medium is a bulk optical recording medium having a bulk layer inside which mark recording is selectively performed at a plurality of positions in a depth direction, and
wherein the recorder records a mark inside the bulk layer as a void.

16. A recording method for converting m-bit data words into n-bit code words, where m and n are both integers and satisfy an expression $2^n \geq 2^m \times 2$, and performing recording on an optical recording medium, the recording method comprising the steps of:
executing encoding for an m-bit data word that has been input, where an n-bit code word is selected and output from a first conversion table in which $2^m$ m-bit data words are associated with $2^m$ n-bit code words selected from $2^n$ n-bit code words or from a second conversion table in which $2^m$ m-bit data words are associated with $2^m$ n-bit code words that have been selected from the $2^n$ n-bit code words and do not overlap with the $2^m$ n-bit code words in the first conversion table, the selected and output n-bit code word having a smaller number of symbols "1" between n-bit code words that may be selected, based on the m-bit data word, from the first and second conversion tables; and performing recording on the optical recording medium at least in part on the basis of the n-bit code word output in the step of executing the encoding.

17. A decoding apparatus to decode a code string obtained by executing encoding for converting m-bit data words into n-bit code words, where m and n are both integers and satisfy an expression $2^n \geq 2^m \times 2$ and where n-bit code words obtained from a first conversion table in which $2^m$ m-bit data words are associated with $2^m$ n-bit code words selected from $2^n$ n-bit code words or n-bit code words obtained from a second conversion table in which $2^m$ m-bit data words are associated with $2^m$ n-bit code words that have been selected from the $2^n$ n-bit code words and that do not overlap with the $2^m$ n-bit code words in the first conversion table are sequentially output, the decoding apparatus comprising:

a first decoding table that is the first conversion table or that is a table in which the $2^m$ m-bit data words are associated with the $2^m$ n-bit code words in the same manner as the first conversion table;

a second decoding table that is the second conversion table or that is a table in which the $2^m$ m-bit data words are associated with the $2^m$ n-bit code words in the same manner as the second conversion table;

a decoder configured to search both the first decoding table and the second decoding table for an m-bit data word associated with an n-bit code word that has been input, in order to output the m-bit data word.

18. A decoding method for decoding a code string obtained by executing encoding for converting m-bit data words into n-bit code words, where m and n are both integers and satisfy an expression $2^n \geq 2^m \times 2$ and where n-bit code words obtained from a first conversion table in which $2^m$ -bit data words are associated with $2^m$ n-bit code words selected from $2^n$ n-bit code words or n-bit code words obtained from a second conversion table in which $2^m$ m-bit data words are associated with $2^m$ n-bit code words that have been selected from the $2^n$ n-bit code words and that do not overlap with the $2^m$ n-bit code words in the first conversion table are sequentially output, the decoding method comprising the step of:

searching, for an m-bit data word associated with an n-bit code word that has been input, both a first decoding table that is the first conversion table or that is a table in which the $2^m$ m-bit data words are associated with the $2^m$ n-bit code words in the same manner as the first conversion table and a second decoding table that is the second conversion table or that is a table in which the $2^m$ m-bit data words are associated with the $2^m$ n-bit code words in the same manner as the second conversion table, in order to output the m-bit data word.

\* \* \* \* \*